US012720817B2

(12) United States Patent
Fujie

(10) Patent No.: US 12,720,817 B2
(45) Date of Patent: Aug. 25, 2026

(54) SEMICONDUCTOR DEVICE

(71) Applicant: ROHM CO., LTD., Kyoto (JP)

(72) Inventor: Shusaku Fujie, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 339 days.

(21) Appl. No.: 18/415,172

(22) Filed: Jan. 17, 2024

(65) Prior Publication Data

US 2024/0153988 A1 May 9, 2024

Related U.S. Application Data

(63) Continuation of application No. PCT/JP2022/022681, filed on Jun. 3, 2022.

(30) Foreign Application Priority Data

Jul. 21, 2021 (JP) ................................ 2021-120728

(51) Int. Cl.
*H01L 29/06* (2006.01)
*H10D 8/00* (2025.01)
*H10D 30/65* (2025.01)
*H10D 62/10* (2025.01)
*H10D 64/00* (2025.01)

(52) U.S. Cl.
CPC ........... *H10D 62/111* (2025.01); *H10D 8/411* (2025.01); *H10D 30/65* (2025.01); *H10D 64/111* (2025.01)

(58) Field of Classification Search
CPC .............................. H10D 62/111; H10D 8/411
See application file for complete search history.

(56) References Cited

U.S. PATENT DOCUMENTS 11,088,243 B2 * 8/2021 Takaoka ............... H10D 12/481
2013/0075877 A1 3/2013 Sakai et al.
2015/0001639 A1 * 1/2015 Fujie ................... H10D 84/151 257/501

(Continued)

FOREIGN PATENT DOCUMENTS

WO 2021/161835 A1 8/2021

OTHER PUBLICATIONS

International Search Report for PCT/JP2022/022681, mailed on Aug. 23, 2022.

(Continued)

*Primary Examiner* — Thao P Le
(74) *Attorney, Agent, or Firm* — Rabin & Berdo, P.C.

(57) ABSTRACT

A semiconductor device includes a chip having a main surface, first potential regions formed in a surface layer portion of the main surface, the second at a distance from the first potential region; a first conductivity type drift region between the first and second potential regions in the surface layer portion; RESURF arrays each including first conductivity type RESURF regions in a surface layer portion of the drift region at a distance from each other in a first direction to expose part of the drift region from the main surface, each RESURF region having an impurity concentration exceeding that of the drift region, the RESURF arrays being at a distance from each other in a second direction intersecting the first direction; a field insulating film covering the drift region and the RESURF arrays on the main surface; and a field electrode on the field insulating film covering the RESURF arrays.

20 Claims, 14 Drawing Sheets

(56) References Cited

U.S. PATENT DOCUMENTS

| | | | | |
|---|---|---|---|---|
| 2017/0338354 | A1* | 11/2017 | Fujie | H10D 62/126 |
| 2022/0416016 | A1* | 12/2022 | Ishida | H10D 30/603 |
| 2024/0097008 | A1* | 3/2024 | Tamura | H10D 30/0281 |
| 2024/0222500 | A1* | 7/2024 | Ishida | H10D 30/65 |

OTHER PUBLICATIONS

Written Opinion of the International Searching Authority for PCT/JP2022/022681, mailed on Aug. 23, 2022.

Office Action issued for corresponding Japanese Patent Application No. 2023-536641, and its English translation, dated May 28, 2026.

* cited by examiner

16(16C)
22a
22
22b
8(9)
II
X
Z
Y
p
23
29
29a
29b
30
26
25a
(28)
n+
III
16
(16A)
17
19
p+
n+
16
(16B)
17
19
p+
n+
27
34
32
33
25b
(28)
25
32a
32b
p
12
16
(16D)
11
15
1A 1A
13
8(9)
40
41 (41A)
41 (41B)
42 (42A)
42 (42B)
Z
X
Y

X
Z
Y
20
(L2)
I 2
20
(L2)
20
(L2)
20
(L2)
21
21
21
21
21
21
13a
22
L1
I 1
25a
(W)
25a
(W)
25a
(W)
25a
(W)
1A 20
(L2)
I 2
X
Z
Y
13a
22
L1
I 1
21
25a
(W)
1A 20
(L2)
I 2
X
Z
Y
13a
22
L1
I 1
21
25a
(W)
1A 20 (L2)
I 2
20 (L2)
20 (L2)
20 (L2)
X
Z
Y
13a
22
L1
I 1
21
21
21
21
21
21
25a (W)
25a (W)
1A
25a (W)
25a (W)

20 (L2)
I 2
20 (L2)
20 (L2)
20 (L2)
X
Z
Y
13a
22
L1
I 1
21
21
21
21
21
21
25a (W)
25a (W)
1A
25a (W)
25a (W)

X
Z
Y
20
(L2)
I 2
21
13a
22
L1
I 1
25a
(W)
1A

X
Z
Y
20
(L2)
I 2
21
13a
22
L1
I 1
25a
(W)
1A 20 (L2)
I 2
20 (L2)
20 (L2)
20 (L2)
X
Z
Y
21
21
21
21
21
21
13a
22
L1
I 1
25a (W)
25a (W)
1A
25a (W)
25a (W)

20 (L2)
I 2
20 (L2)
20 (L2)
20 (L2)
X
Z
Y
21
21
21
L1
I 1
13a
22
25a (W)
25a (W)
1A
25a (W)
25a (W)

20
(L4,L6)
I2
X
Z
Y
13a
22
L5
L3
21α
(21)
21β
(21)
25a
(W)
1A 20
(L2)
I2
X
Z
Y
I1
L1
13a
22
21
25a
(W)
1A 20
(L2)
I 2
20
(L2)
20
(L2)
20
(L2)
X
Z
Y
13a
22
L1
I 1
21
21
21
21
21
21
25a(W)
1A
25a(W)

20(L2)
I 2
20(L2)
X
Z
Y
13a
22
L1
I 1
21
21
21
21
21
21
25a
(W)
25a
(W)
1A
25a
(W)
25a
(W)

Z
X
Y
42 (42B)
42 (42A)
43
44
29
50
49
47
25a(28)
8(9)
25
22
40
48
46
33
51
32
45
41 (41B)
41 (41A)
p+
n+
p
n
n−
60
11
14
10(6)
21
3
13
7
1B
31
18
17
12
16
19
4
2

Z
X
Y
41 (41B)
41 (41A)
42 (42B)
42 (42A)
43
66
29
68
49
47
25a(28)
61
25
22
40
48
69
67
n+
63
n
11
62
10(6)
21
3
p
p+
65
12
64
7
13
4
2
1C

SEMICONDUCTOR DEVICE

CROSS REFERENCE TO RELATED APPLICATIONS

The present application is a bypass continuation of International Patent Application No. PCT/JP2022/022681, filed on Jun. 3, 2022, which claims priority to Japanese Patent Application No. 2021-120728 filed with the Japan Patent Office on Jul. 21, 2021, the entire disclosure of which is incorporated herein by reference.

BACKGROUND

1. Field of the Disclosure

The present disclosure relates to a semiconductor device.

2. Description of the Related Art

US2013/075877A1 discloses a semiconductor device including a semiconductor layer, a first electrode, a second electrode, a horizontal element, a LOCOS oxide film, and a resistive field plate. The first electrode is formed on a surface of the semiconductor layer. The second electrode is formed on the surface of the semiconductor layer at an interval from the first electrode. The horizontal element is formed in a region between the first electrode and the second electrode in a surface layer portion of the surface of the semiconductor layer, and is electrically connected to the first electrode and to the second electrode. The LOCOS oxide film separates portions, which constitute the horizontal element, from each other in the surface of the semiconductor layer. The resistive field plate is formed on the LOCOS oxide film.

DETAILED DESCRIPTION OF THE PREFERRED EMBODIMENTS

Hereinafter, a detailed description will be given of the embodiments with reference to accompanying drawings. The accompanying drawings are schematic drawings and not illustrated in a strict manner, and a scale, etc., are not necessarily in agreement. Further, the same reference symbols are given to corresponding structures in the accompanying drawings, with redundant description being omitted or simplified. A description which has been made before omission or simplification will be applied to a structure, the description of which has been omitted or simplified.

Figure 1:
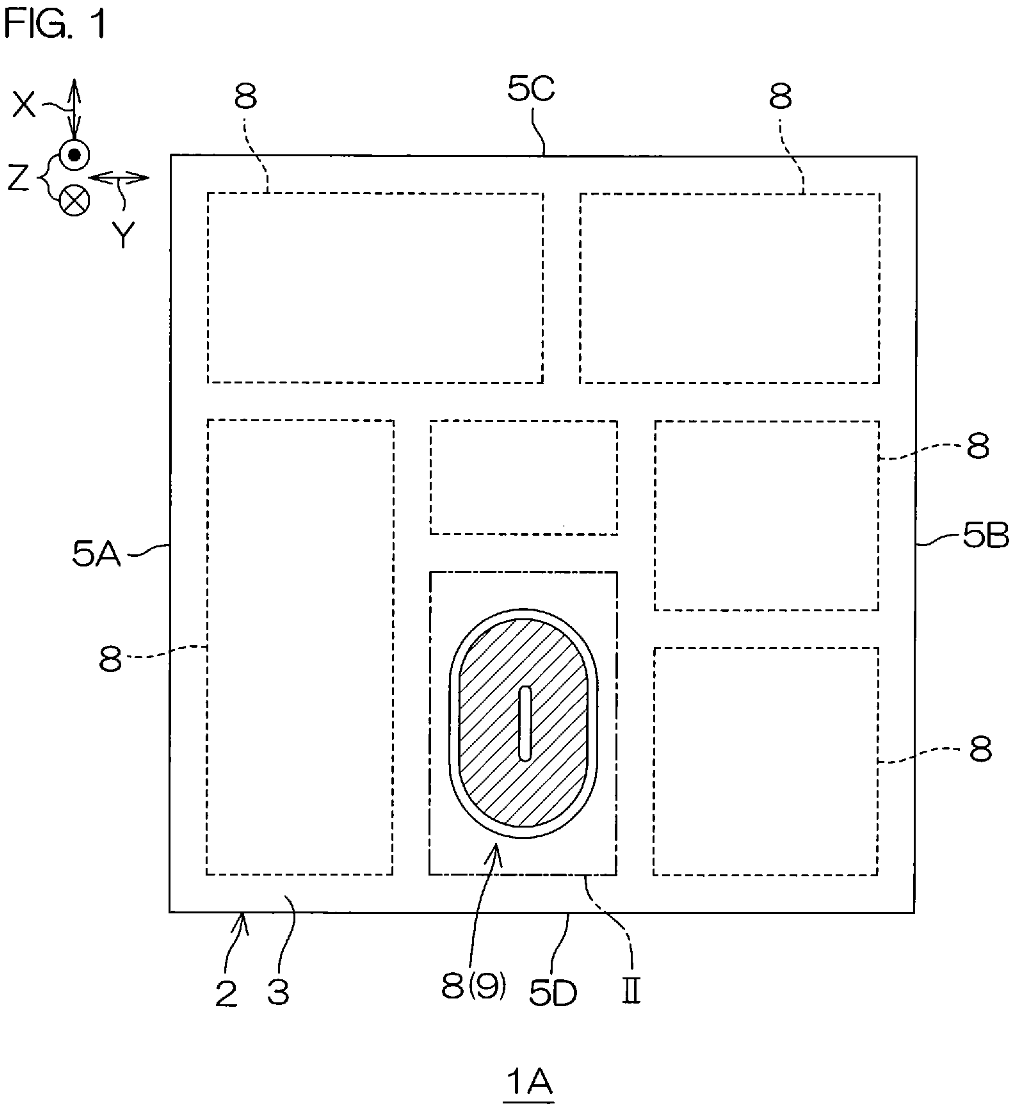
FIG. 1 is a plan view showing a chip of a semiconductor device according to a first embodiment.
Figure 2:
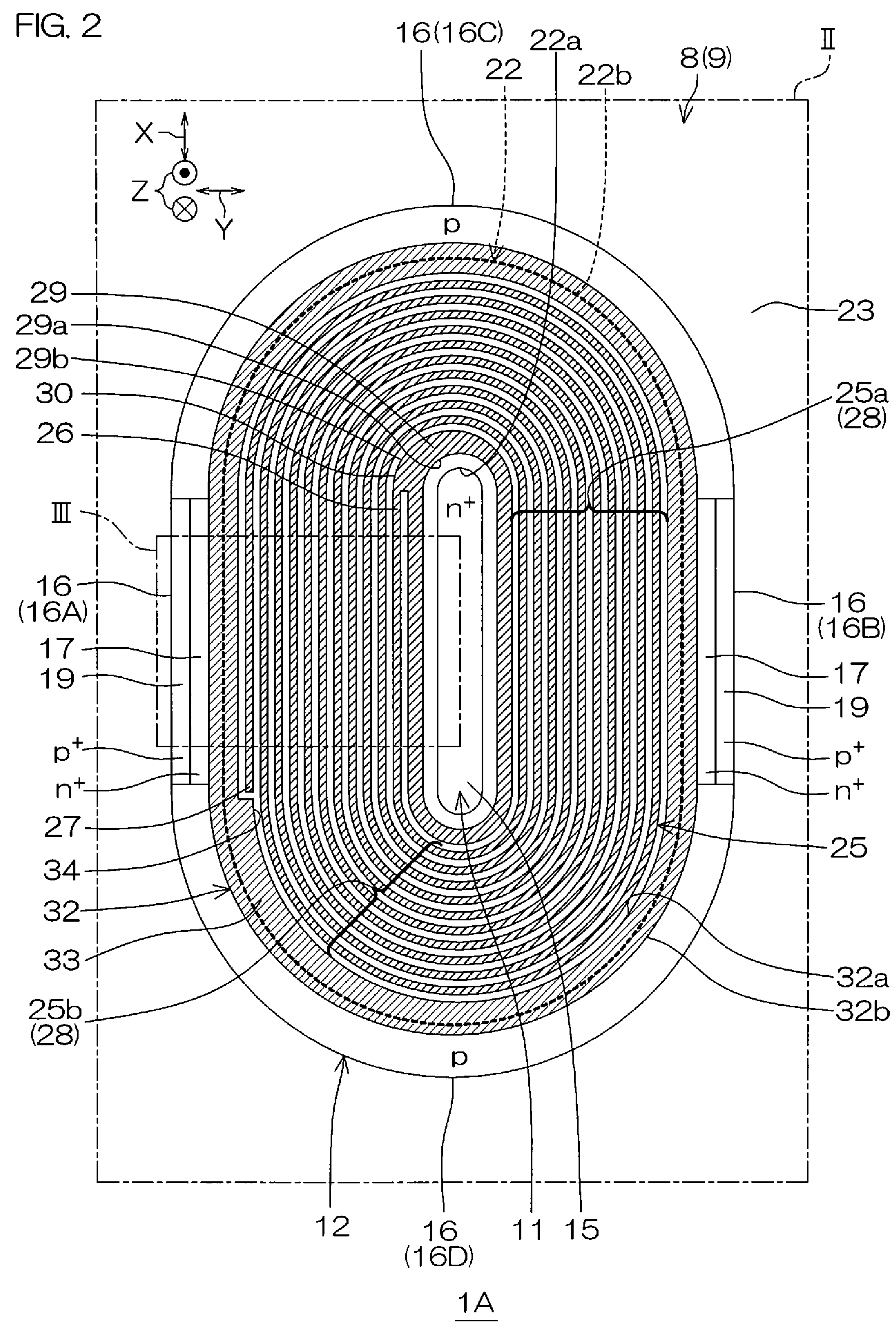
FIG. 2 is an enlarged view of region II shown in FIG. 1.
Figure 3:
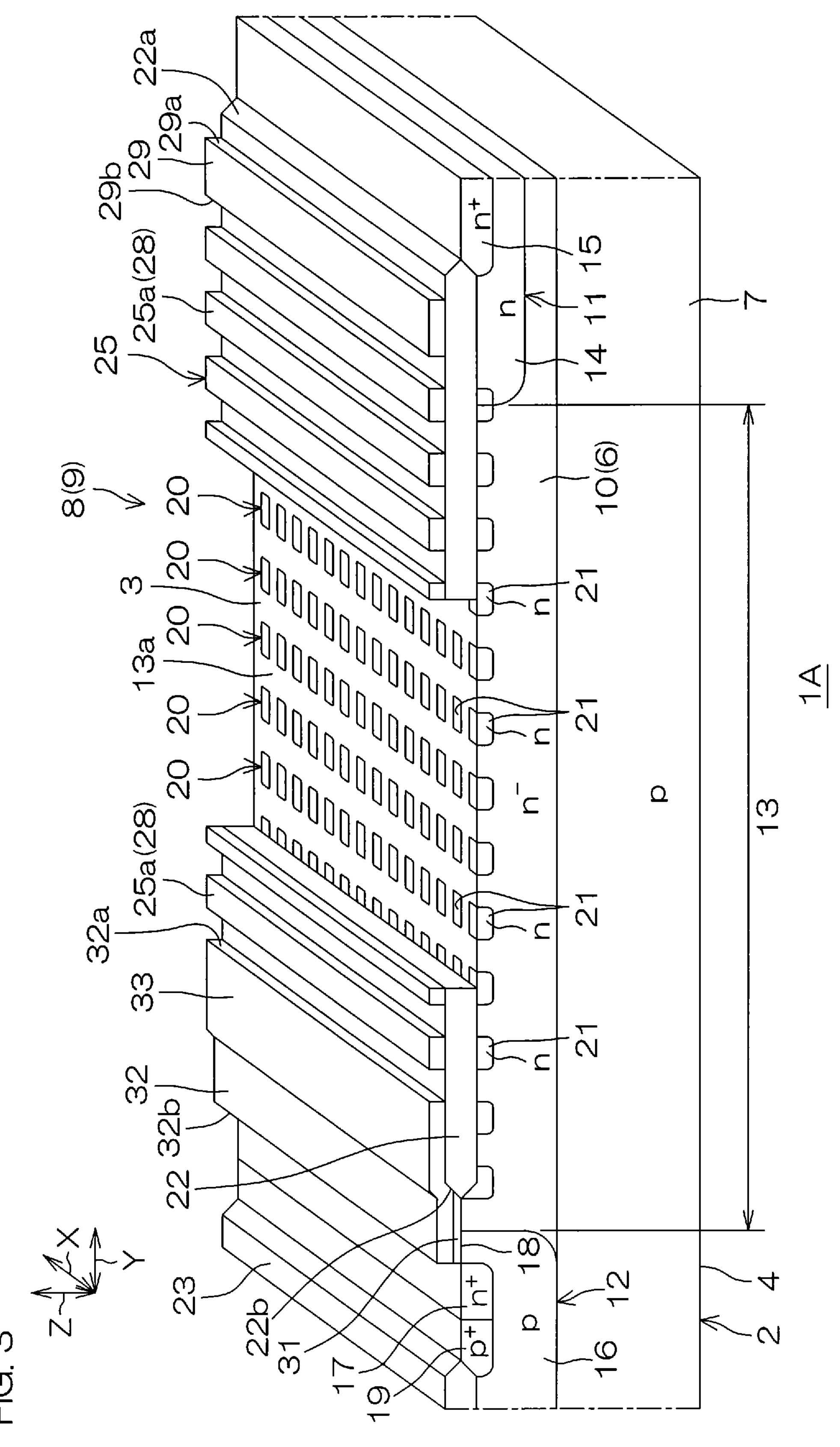
FIG. 3 is a partially cutaway perspective cross-sectional view of region III shown in FIG. 2.
Figure 4:
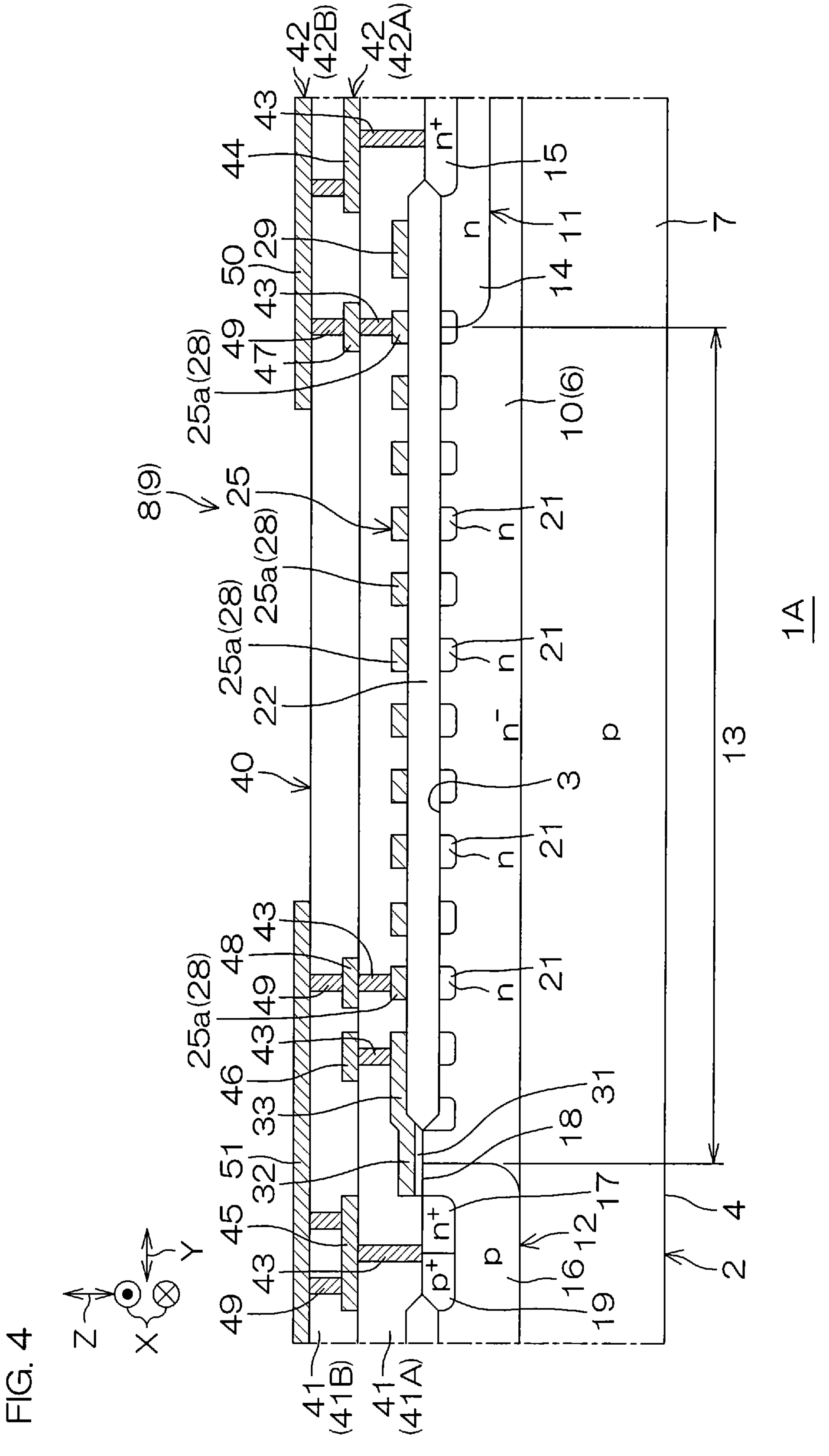
FIG. 4 is a cross-sectional view of region III shown in FIG. 2.
Figure 5:
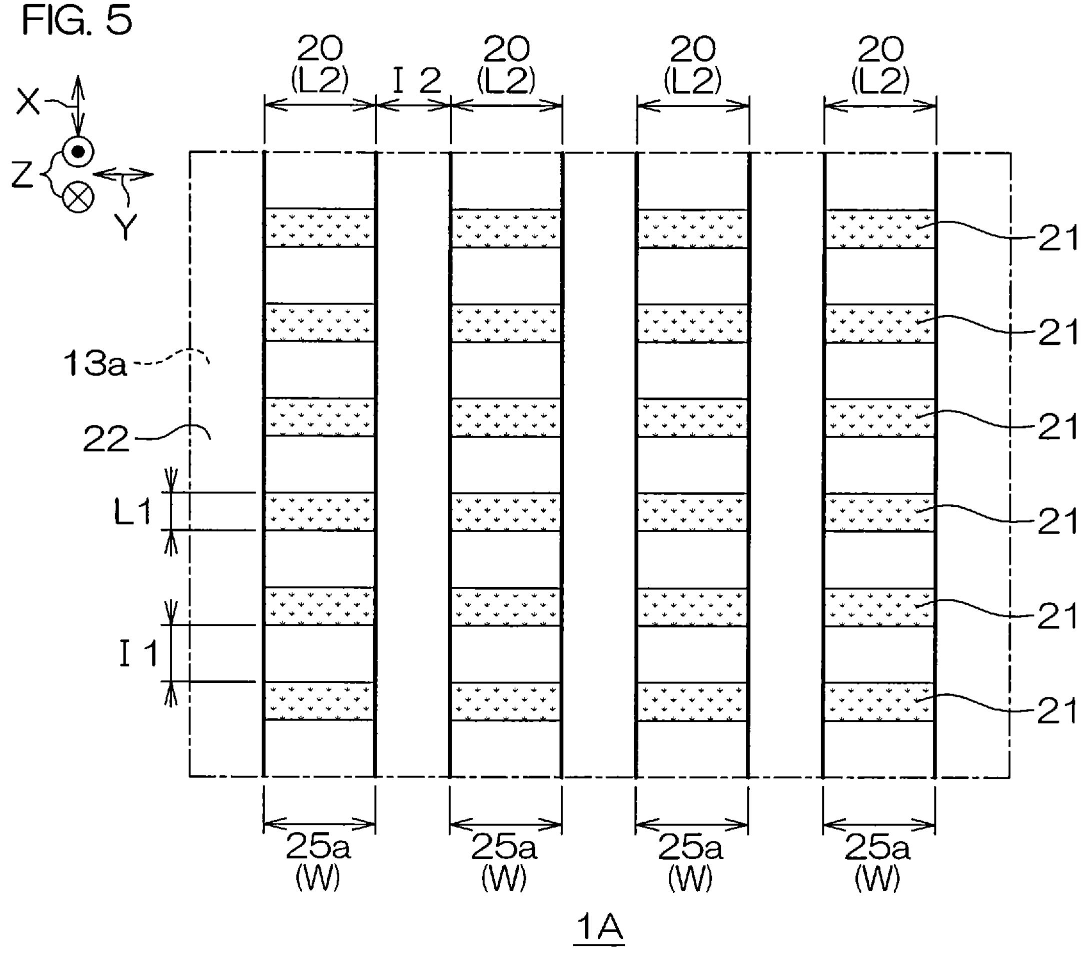
FIG. 5 is a plan view showing a first layout example of a RESURF array and a field electrode shown in FIG. 3.

FIG. 1 is a plan view showing a chip 2 of a semiconductor device 1A according to a first embodiment. FIG. 2 is an enlarged view of region II shown in FIG. 1. FIG. 3 is a partially cutaway perspective cross-sectional view of region III shown in FIG. 2. FIG. 4 is a cross-sectional view of region III shown in FIG. 2. FIG. 5 is a plan view showing a first layout example of a RESURF array 20 and a field electrode 25 both of which are shown in FIG. 3. For clarity, a plurality of RESURF regions 21 are shown by hatching, and the field electrode 25 is shown by a thick line in FIG. 5.

Referring to FIG. 1 to FIG. 5, the semiconductor device 1A includes the chip 2 (semiconductor chip) which is made of a silicon and which is formed in a rectangular parallelepiped shape. The chip 2 has a first main surface 3 on one side, a second main surface 4 on the other side, and first to fourth side surfaces 5A to 5D that connect the first main surface 3 and the second main surface 4 together.

The first main surface 3 and the second main surface 4 are each formed in a quadrangular shape in a plan view seen from their normal directions Z (hereinafter, referred to simply as a "plan view"). The normal direction Z is also a thickness direction of the chip 2. The first side surface 5A and the second side surface 5B extend in a first direction X, and face each other in a second direction Y that intersects the first direction X (in detail, perpendicularly intersects the first direction X). The third side surface 5C and the fourth side surface 5D extend in the second direction Y, and face each other in the first direction X.

The semiconductor device 1A includes an n-type (first conductivity type) first semiconductor region 6 formed in a region on the first main surface 3 side in the chip 2. The first semiconductor region 6 is formed in a layer shape extending along the first main surface 3, and is exposed from the first main surface 3 and from the first to fourth side surfaces 5A to 5D. In other words, the first semiconductor region 6 forms the first main surface 3 and parts of the first to fourth side surfaces 5A to 5D.

The n-type impurity concentration of the first semiconductor region 6 may be not less than $1\times10^{14}$ $cm^{-3}$ and not more than $1\times10^{16}$ $cm^{-3}$ (preferably, not less than $1.0\times10^{15}$ $cm^{-3}$ and not more than $5.0\times10^{15}$ $cm^{-3}$). The thickness of the first semiconductor region 6 may be not less than 5 μm and not more than 20 μm. In this embodiment, the first semiconductor region 6 is formed by an n-type epitaxial layer.

The semiconductor device 1A includes a p-type (second conductivity type) second semiconductor region 7 formed in a region on the second principal surface 4 side in the chip 2. The second semiconductor region 7 may be referred to as a "base region." The second semiconductor region 7 is formed in a layer shape extending along the second main surface 4, and is exposed from the second main surface 4 and from the first to fourth side surfaces 5A to 5D. In other words, the second semiconductor region 7 forms the second main surface 4 and parts of the first to fourth side surfaces 5A to 5D. The second semiconductor region 7 is connected to the first semiconductor region 6 inside the chip 2.

The second semiconductor region 7 may have a p-type impurity concentration of not less than $1.0\times10^{13}$ $cm^{-3}$ and not more than $1.0\times10^{15}$ $cm^{-3}$. The thickness of the second semiconductor region 7 may be not less than 50 μm and not more than 400 μm. In this embodiment, the second semiconductor region 7 is formed by a p-type semiconductor substrate. In other words, the chip 2 has a layered structure including a semiconductor substrate and an epitaxial layer, and includes the first semiconductor region 6 formed in the epitaxial layer and the second semiconductor region 7 formed in the semiconductor substrate.

The semiconductor device 1A includes a plurality of device regions 8 that are demarcated at the first main surface 3. The number and the arrangement of the plurality of device regions 8 are arbitrary. The plurality of device regions 8 each include a functional device formed by use of regions inside and outside the chip 2. The functional device may include at least one among a semiconductor switching device, a semiconductor rectifying device, and a passive device. The functional device may include an electrical circuit network in which at least two among the semiconductor switching device, the semiconductor rectifying device, and the passive device are combined together.

The semiconductor switching device may include at least one among MISFET (Metal Insulator Semiconductor Field Effect Transistor), BJT (Bipolar Junction Transistor), IGBT (Insulated Gate Bipolar Junction Transistor), and JFET (Junction Field Effect Transistor). The semiconductor rectifying device may include at least one among a pn junction diode, a pin junction diode, a Zener diode, a Schottky barrier diode, and a fast recovery diode. The passive device may include at least one among a resistor, a capacitor, an inductor, and a fuse.

The plurality of device regions 8 include at least one (in this embodiment, one) transistor region 9 (see region II of FIG. 1). The transistor region 9 includes LDMISFET (Lateral Double Diffused MISFET) as one example of MISFET. In this embodiment, the LDMISFET consists of a high withstand voltage device to which a drain voltage VDS equal to or more than 800 V in an OFF state can be applied. A structure on the transistor region 9 side will be hereinafter described in detail.

Referring to FIG. 2 to FIG. 5, the semiconductor device 1A includes an n-type impurity region 10 formed in a surface layer portion of the first main surface 3 in the transistor region 9. In this embodiment, the impurity region 10 is formed by use of a part of the first semiconductor region 6. Therefore, the impurity region 10 has an n-type impurity concentration equal to the n-type impurity concentration of the first semiconductor region 6. In this embodiment, the impurity region 10 is formed in an oval shape in a plan view. The impurity region 10 may be formed in a circular shape, an elliptical shape, or a polygonal shape (for example, quadrangular shape).

The semiconductor device 1A includes a first potential region 11, a second potential region 12, and a drift region 13 that are formed in the surface layer portion of the first main surface 3 in the transistor region 9. The first potential region 11 is a region to which a first potential is applied, and the second potential region 12 is a region to which a second potential differing from the first potential is applied. For example, the first potential region 11 is a high-potential region to which a high potential (first potential) is applied, and the second potential region 12 is a low-potential region to which a low potential (second potential) less than a high potential is applied.

The first potential region 11 is formed in a central portion of the impurity region 10. The second potential region 12 is formed in the surface layer portion of the first main surface 3 at a distance from the first potential region 11 in a cross-sectional view, and is connected to the impurity region 10. The drift region 13 is formed in a region between the first potential region 11 and the second potential region 12 in the impurity region 10.

The first potential region 11 includes an n-type well region 14 formed in a surface layer portion of the impurity region 10. The well region 14 has an n-type impurity concentration higher than the impurity region 10. The n-type impurity concentration of the well region 14 may be not less than $1.0\times10^{15}$ $cm^{-3}$ and not more than $1.0\times10^{18}$ $cm^{-3}$. In this embodiment, the well region 14 is formed in an oval shape extending along the impurity region 10 in a plan view. The well region 14 may be formed in a circular shape, an elliptical shape, or a polygonal shape (for example, quadrangular shape).

The first potential region 11 includes an n-type drain region 15 formed in a surface layer portion of the well region 14. The drain region 15 has an n-type impurity concentration higher than the well region 14. The n-type impurity concentration of the drain region 15 may be not less than $1.0\times10^{18}$ $cm^{-3}$ and not more than $1.0\times10^{21}$ $cm^{-3}$. The drain region 15 is formed in an internal portion of the well region 14 at a distance from a peripheral edge of the well region 14. In this embodiment, the drain region 15 is formed in an oval shape extending along the well region 14 in a plan view. The drain region 15 may be formed in a circular shape, an elliptical shape, or a polygonal shape (for example, quadrangular shape).

The second potential region 12 includes a p-type body region 16 formed in the surface layer portion of the first main surface 3 so as to be connected to the impurity region 10. The body region 16 may have a p-type impurity concentration of not less than $1.0\times10^{15}$ $cm^{-3}$ and not more than $1.0\times10^{18}$ $cm^{-3}$. The body region 16 is connected to the second semiconductor region 7, and fixes the second semiconductor region 7 at the same electric potential. The body region 16 is formed in a belt shape extending along a peripheral edge of the impurity region 10. In detail, the body region 16 is formed in an annular shape (in this embodiment, oval annular shape) surrounding the impurity region 10, and demarcates the impurity region 10 in a predetermined shape (in this embodiment, oval shape).

The body region 16 includes a first region 16A, a second region 16B, a first connection region 16C, and a second connection region 16D in a plan view. The first region 16A is formed in a region on one side of the impurity region 10 in the second direction Y, and extends in a belt shape in the first direction X. The second region 16B is formed in a region on the other side of the impurity region 10 so as to face the first region 16A across the impurity region 10 in the second direction Y, and extends in parallel with the first region 16A. Preferably, the length of the first region 16A and the length of the second region 16B are each equal to or less than the length of the drain region 15 in the first direction X.

In this embodiment, the first connection region 16C extends in a circular-arc belt shape between one end of the first region 16A and one end of the second region 16B, and connects the end of the first region 16A and the end of the second region 16B together. As a matter of course, the first connection region 16C may be formed in a linear belt shape extending in the second direction Y. The second connection region 16D extends in a circular-arc belt shape between the other end of the first region 16A and the other end of the second region 16B, and connects the other end of the first region 16A and the other end of the second region 16B together. As a matter of course, the second connection region 16D may be formed in a linear belt shape extending in the second direction Y.

The second potential region 12 includes at least one (in this embodiment, a plurality of) n-type source region(s) 17 formed in a surface layer portion of the body region 16 at a distance from the impurity region 10. The source region 17 is formed on the inner-edge side (impurity-region-10 side) of the body region 16, and forms a MISFET channel region 18 with the impurity region 10 (drift region 13).

The source region 17 has an n-type impurity concentration higher than the well region 14. The n-type impurity concentration of the source region 17 may be not less than $1.0\times10^{18}$ $cm^{-3}$ and not more than $1.0\times10^{21}$ $cm^{-3}$. Preferably, the n-type impurity concentration of the source region 17 is equal to the n-type impurity concentration of the drain region 15.

In this embodiment, the plurality of source regions 17 are formed in an ended belt shape in a region of a part of the body region 16 in a plan view. In detail, the plurality of source regions 17 are formed in a surface layer portion of the first region 16A and a surface layer portion of the second region 16B at a distance from the first connection region 16C and the second connection region 16D, respectively, and are not formed in the first connection region 16C and the second connection region 16D. The source region 17 extends in an ended belt shape along the first region 16A and along the second region 16B in a plan view.

The plurality of source regions 17 face the drain region 15 in the second direction Y, and form a current path extending in the second direction Y in the drift region 13 between the drain region 15 and the source region 17. Preferably, the length of each of the source regions 17 is equal to or less than the length of the drain region 15 in the first direction X. As a matter of course, a single source region 17 having an annular shape (in detail, oval annular shape) surrounding the impurity region 10 may be formed. Additionally, the single or plurality of source regions 17 may be formed in at least one region among the first region 16A, the second region 16B, the first connection region 16C, and the second connection region 16D of the body region 16.

The second potential region 12 includes at least one (in this embodiment, a plurality of) p-type contact region(s) 19 formed in a region differing from that of the plurality of source regions 17 in the surface layer portion of the body region 16. The plurality of contact regions 19 are formed on the outer-edge side (on the side opposite to the impurity region 10) of the body region 16, and face the channel region 18 across a corresponding one of the source regions 17. The plurality of contact regions 19 have a p-type impurity concentration higher than the body region 16. The p-type impurity concentration of the plurality of contact regions 19 may be not less than $1.0\times10^{18}$ $cm^{-3}$ and not more than $1.0\times10^{21}$ $cm^{-3}$.

In this embodiment, the plurality of contact regions 19 are formed in an ended belt shape in a region of a part of the body region 16 in a plan view. In detail, the plurality of contact regions 19 are formed in the first region 16A and the second region 16B at a distance from the first connection region 16C and the second connection region 16D of the body region 16, respectively, and are not formed in the first connection region 16C and the second connection region 16D of the body region 16. The plurality of contact regions 19 extend in an ended belt shape along the first region 16A and along the second region 16B in a plan view.

Each of the plurality of contact regions 19 faces the drain region 15 in the second direction Y. Preferably, the length of each of the contact regions 19 is equal to or less than the length of the drain region 15 in the first direction X. As a matter of course, a single contact region 19 having an annular shape (in detail, oval annular shape) surrounding the impurity region 10 may be formed. Additionally, the single or plurality of contact regions 19 may be formed in at least one region among the first region 16A, the second region 16B, the first connection region 16C, and the second connection region 16D of the body region 16.

The drift region 13 is formed in a region between the first potential region 11 and the second potential region 12, and forms a current path that connects the first potential region 11 and the second potential region 12 together. In detail, the drift region 13 is formed in a region between the drain region 15 (well region 14) and the plurality of source regions 17 (body region 16) in the impurity region 10. Thereby, the drift region 13 forms a current path that connects the drain region 15 and the plurality of source regions 17 together.

The drift region 13 consists of a part of the impurity region 10 (first semiconductor region 6). The drift region 13 is formed in an annular shape (in this embodiment, oval annular shape) surrounding the drain region 15. In this embodiment, the drift region 13 has a first portion (linear portion) demarcated in a linear shape extending in the second direction Y by means of the first region 16A (second region 16B) of the body region 16 and a second portion (circular arc portion) demarcated in a circular arc shape by means of the first connection region 16C (second connection region 16D) of the body region 16.

The width of the drift region 13 may be not less than 50 μm and not more than 200 μm. The width of the drift region 13 is a distance between the first potential region 11 and the second potential region 12. The drift region 13 may be formed with a substantially constant width along an annular shape (in this embodiment, oval annular shape). The width of the drift region 13 may gradually increase from the linear portion toward the middle of the circular arc portion. In this case, the linear portion of the drift region 13 may be formed with a substantially constant width.

Referring to FIG. 3 to FIG. 5, the semiconductor device 1A includes a plurality of (in this embodiment, thirteen) RESURF arrays 20 partially formed in a surface layer portion of the drift region 13 so as to expose a part of the drift region 13 from the first main surface 3. The plurality of RESURF arrays 20 each include a plurality of n-type RESURF regions 21 arranged in the surface layer portion of the drift region 13 at a distance from each other in the first direction X so as to expose a part of a region, which serves as a current path, of the drift region 13 from the first main surface 3. The plurality of RESURF arrays 20 are arranged at a distance from each other in the second direction Y.

In detail, the plurality of RESURF arrays 20 are arranged at an interval from each other along the mutually-facing direction (second direction Y) of both the first potential region 11 and the second potential region 12 in a region between the first potential region 11 and the second potential region 12. In more detail, the plurality of RESURF arrays 20 are arranged in a region between the drain region 15 and the body region 16. In still more detail, the plurality of RESURF arrays 20 are arranged in a region between the well region 14 and the body region 16.

Preferably, the plurality of RESURF arrays 20 are formed in the linear portion of the drift region 13 at a distance from the circular arc portion of the drift region 13, and are not formed in the circular arc portion of the drift region 13. In other words, preferably, the plurality of RESURF arrays 20 are formed in a region between the drain region 15 and the first region 16A (second region 16B) of the body region 16, and are not formed in a region between the drain region 15 and the first connection region 16C (second connection region 16D) of the body region 16.

The number and the width of the RESURF arrays 20 are arbitrary, and are adjusted in accordance with the width of the drift region 13. Additionally, the number of the RESURF regions 21 included in each of the RESURF arrays 20 is arbitrary, and is adjusted in accordance with the length of the linear portion of the drift region 13 (length of the RESURF array 20). In this embodiment, a form (first layout example) in which the plurality of RESURF arrays 20 include the RESURF regions 21 the number of which is equal in each of the RESURF arrays 20 is shown.

The plurality of RESURF regions 21 have an n-type impurity concentration higher than the drift region 13. Preferably, the n-type impurity concentration of the plurality of RESURF regions 21 is less than the n-type impurity concentration of the well region 14. The n-type impurity concentration of the plurality of RESURF regions 21 may be not less than $5\times10^{15}$ $cm^{-3}$ and not more than $1\times10^{17}$ $cm^{-3}$. Preferably, the n-type impurity concentration of the plurality of RESURF regions 21 is not less than $1\times10^{16}$ $cm^{-3}$ and not more than $5\times10^{16}$ $cm^{-3}$.

The plurality of RESURF regions 21 are arranged at a distance from each other in a direction (i.e., first direction X) perpendicular to a mutually-facing direction (i.e., second direction Y) of the first and second potential regions 11 and 12 in each of the RESURF arrays 20. In other words, the plurality of RESURF regions 21 face each other in the first direction X across a part of the drift region 13 in each of the RESURF arrays 20. In this embodiment, the plurality of RESURF regions 21 are each formed in a belt shape extending in the second direction Y in each of the RESURF arrays 20, and expose a part of the drift region 13 from the first main surface 3 in a stripe shape extending in the second direction Y.

Each of the plurality of RESURF regions 21 has a first end portion on the first potential region 11 side and a second end portion on the second potential region 12 side. Each of the RESURF regions 21 has a potential gradient that is formed in accordance with a potential gradient between the first and second potential regions 11 and 12. Therefore, the first end portion of each of the RESURF regions 21 becomes relatively high in potential, and the second end portion of each of the RESURF regions 21 becomes lower in potential than the first end portion.

The plurality of RESURF regions 21 face each other across a part of the drift region 13 between the plurality of RESURF arrays 20 in the second direction Y. The plurality of RESURF regions 21 expose a part of the drift region 13 from the first main surface 3 in a stripe shape extending in the first direction X between the plurality of RESURF arrays 20. In other words, the plurality of RESURF regions 21 are arranged in a matrix manner at a distance from each other in the first and second directions X and Y in a plan view. Additionally, the plurality of RESURF regions 21 expose a part of the drift region 13 from the first main surface 3 in a lattice shape extending in the first and second directions X and Y.

The plurality of RESURF regions 21 are formed at an interval from a bottom portion of the drift region 13 toward the first main surface 3 side, and face the second semiconductor region 7 across a part of the drift region 13. In this embodiment, the plurality of RESURF regions 21 are formed more shallowly than the well region 14, and are formed more deeply than the drain region 15. The innermost RESURF array 20 closest to the well region 14 among the plurality of RESURF arrays 20 may include a single or a plurality of RESURF regions 21 connected to the well region 14. As a matter of course, the plurality of RESURF regions 21 may be formed at an interval from the well region 14.

The outermost RESURF array 20 closest to the body region 16 among the plurality of RESURF arrays 20 may include a single or a plurality of RESURF regions 21 connected to the body region 16. As a matter of course, the plurality of RESURF regions 21 may be formed at an interval from the body region 16. In this embodiment, an example is shown in which the innermost RESURF array 20 is connected to the well region 14 and in which the outermost RESURF array 20 is formed at an interval from the body region 16.

Referring to FIG. 5, each of the plurality of RESURF regions 21 has a first length L1 along the first direction X and a second length L2 along the second direction Y. The first length L1 may be not less than 0.5 μm and not more than 2 μm. Preferably, the first length L1 is not less than 0.8 μm and not more than 1.5 μm. The second length L2 may be not less than 0.5 μm and not more than 5 μm. Preferably, the second length L2 is not less than 2 μm and not more than 4 μm. Preferably, the second length L2 is more than the first length L1 ($L1<L2$).

The plurality of RESURF regions 21 are arranged at first intervals I1 in the first direction X, and are arranged at second intervals I2 in the second direction Y (see FIG. 5). The first interval I1 may be not less than 0.5 μm and not more than 3 μm. Preferably, the first interval I1 is not less than 1 μm and not more than 2 μm. The second interval I2 may be not less than 0.5 μm and not more than 5 μm.

Preferably, the second interval I2 is not less than 1 μm and not more than 2 μm. Preferably, the second interval I2 is less than the first interval I1 ($I2<I1$). Preferably, the plurality of RESURF regions 21 are arranged at equal intervals in the first direction X, and are arranged at equal intervals in the second direction Y. In other words, preferably, the plurality of RESURF arrays 20 are arranged at equal intervals in the second direction Y.

The semiconductor device 1A includes a drift exposed region 13*a* demarcated in a region between the mutually-adjoining plurality of RESURF regions 21 in the surface layer portion of the drift region 13. The drift exposed region 13*a* consists of a part of the drift region 13. The plurality of drift exposed regions 13*a* extend in a lattice shape in the first and second directions X and Y in a region between the first and second potential regions 11 and 12 in a plan view.

The n-type impurity concentration of the drift exposed region 13*a* is less than the n-type impurity concentration of the RESURF region 21. Therefore, the density of an electric current flowing through the drift exposed region 13*a* is less than the density of an electric current flowing through the RESURF region 21. On the other hand, a depletion layer that starts and spreads from the drift exposed region 13*a* is larger than a depletion layer that starts and spreads from the RESURF region 21. Therefore, in the transistor region 9, a decrease in breakdown voltage is suppressed by the drift exposed region 13*a* (drift region 13), and on-resistance Ron is reduced by the plurality of RESURF regions 21 (plurality of RESURF arrays 20) having a relatively high concentration.

The semiconductor device 1A includes a field insulating film 22 formed on the first main surface 3 so as to cover the drift region 13 and the plurality of RESURF arrays 20 (plurality of RESURF regions 21) in the transistor region 9. The field insulating film 22 includes silicon oxide. In this embodiment, the field insulating film 22 is made of a LOCOS film (Local oxidation of silicon film) formed by selective oxidation of the first main surface 3. The field insulating film 22 may have a thickness of not less than 0.1 μm and not more than 5 μm.

The field insulating film 22 is formed in an annular shape (in this embodiment, oval annular shape) covering a region between the drain region 15 and the body region 16 in a plan view. The field insulating film 22 includes an inner edge portion 22*a* and an outer edge portion 22*b*. In FIG. 2, the outer edge portion 22*b* of the field insulating film 22 is shown by a broken line. The inner edge portion 22*a* of the field insulating film 22 covers the well region 14, and exposes the drain region 15.

The outer edge portion 22*b* of the field insulating film 22 is formed at an interval from an inner edge of the body region 16 toward the first potential region 11 side, and exposes the body region 16, the source region 17, and the contact region 19. The outer edge portion 22*b* of the field insulating film 22 exposes a part of the drift region 13 from between the inner edge of the body region 16 and the outer edge portion 22*b*. The outer edge portion 22*b* of the field insulating film 22 may expose a part of the plurality of RESURF regions 21 from between the inner edge of the body region 16 and the outer edge portion 22*b*.

The semiconductor device 1A includes an outer field insulating film 23 formed on the first main surface 3 so as to cover a region outside the transistor region 9. The outer field insulating film 23 has a thickness equal to that of the field insulating film 22, and includes the same material as the field insulating film 22. In other words, in this embodiment, the outer field insulating film 23 is made of a LOCOS film. The outer field insulating film 23 covers an outer edge of the body region 16, and exposes the body region 16, the source region 17, and the contact region 19.

Referring to FIG. 3 to FIG. 5, the semiconductor device 1A includes a field electrode 25 arranged on the field insulating film 22. The field electrode 25 is arranged in a region between the first and second potential regions 11 and 12 so as to cover the plurality of RESURF arrays 20 in a plan view. In this embodiment, the field electrode 25 includes conductive polysilicon (n-type or p-type polysilicon).

In this embodiment, the field electrode 25 is made of a field resistance film electrically connected to the first and second potential regions 11 and 12. In detail, the field electrode 25 is electrically connected to the drain region 15 and to the source region 17 (to the body region 16 and to the contact region 19), and forms a potential gradient that gradually decreases from the first potential region 11 toward the second potential region 12.

The field electrode 25 is linearly drawn around along the RESURF array 20 so as to cover each of the plurality of RESURF arrays 20 in a plan view. In other words, the field electrode 25 covers each of the plurality of RESURF regions 21 of each of the RESURF arrays 20. The field electrode 25 extends in a linear shape intersecting the plurality of RESURF arrays 20 so as to cover each of the plurality of RESURF arrays 20 once in a plan view. In other words, if a single straight line that connects the first and second potential regions 11 and 12 together in a plan view is set, the field electrode 25 crosses this straight line multiple times.

The field electrode 25 has a plurality of first line portions 25*a* and a plurality of second line portions 25*b*. Each of the plurality of first line portions 25*a* covers the linear portion of the drift region 13 in a region between the first and second potential regions 11 and 12 in a plan view. In other words, each of the plurality of first line portions 25*a* covers a region between the drain region 15 and the first region 16A (second region 16B) of the body region 16.

The plurality of first line portions 25*a* each extend in a linear shape in the first direction X, and are arranged at a distance from each other in the second direction Y in a plan view. Preferably, at least one first line portion 25*a* covers three or less RESURF arrays 20. Particularly preferably, at least one first line portion 25*a* covers two or less RESURF arrays 20. In this embodiment, the plurality of first line portions 25*a* are formed in one-to-one correspondence with the plurality of RESURF arrays 20, respectively, and cover each of the plurality of RESURF arrays 20 once.

In other words, the plurality of first line portions 25*a* face only the single RESURF array 20 at a distance from the other RESURF arrays 20 in a plan view. The plurality of first line portions 25*a* cover all of the RESURF regions 21 of a corresponding one of the RESURF arrays 20. In other words, the plurality of first line portions 25*a* are each placed directly on a stripe portion extending in the second direction Y in the drift exposed region 13*a*. In this embodiment, the plurality of first line portions 25*a* cover the entire area of all of the RESURF regions 21 of a corresponding one of the RESURF arrays 20.

An inner edge portion on the first potential region 11 side of the plurality of first line portions 25*a* may be placed directly on the first end portion of all of the RESURF regions 21 of a corresponding one of the RESURF arrays 20. An outer edge portion on the second potential region 12 side of the plurality of first line portions 25*a* may be placed directly on the second end portion of all of the RESURF regions 21 of a corresponding one of the RESURF arrays 20.

Preferably, the inner edge portion of each of the first line portions 25*a* is formed so as to deviate toward the first potential region 11 side or toward the second potential region 12 side with respect to the first end portion of each of the RESURF regions 21 in consideration of the potential gradient of each of the first line portions 25*a* and the potential gradient of each of the RESURF regions 21. As a matter of course, the outer edge portion of each of the first line portions 25*a* may be formed so as to deviate toward the first potential region 11 side or toward the second potential region 12 side with respect to the second end portion of each of the RESURF regions 21.

The plurality of second line portions 25*b* each extend in a linear shape in the second direction Y, and are arranged at a distance from each other in the first direction X in a plan view. The plurality of second line portions 25*b* each cover the circular arc portion of the drift region 13 in a region between the first and second potential regions 11 and 12 in a plan view. In other words, the plurality of second line portions 25*b* each cover a region between the drain region 15 and the first connection region 16C (second connection region 16D) of the body region 16.

In this embodiment, the plurality of second line portions 25*b* each extend in a circular arc shape along the circular arc portion of the drift region 13, and are each connected to the plurality of first line portions 25*a* placed at the linear portion on one side of the drift region 13 and to the plurality of first line portions 25*a* placed at the linear portion on the other side of the drift region 13.

In this embodiment, the plurality of second line portions 25*b* face only the drift region 13 (circular arc portion) across the field insulating film 22, and do not face the RESURF array 20. In other words, in this embodiment, the field electrode 25 covers the plurality of RESURF arrays 20 in its part extending in a linear shape, and does not cover the RESURF array 20 in its part extending in a circular-arc shape.

The field electrode 25 concentrically surrounds the first potential region 11 multiple times in a plan view. In more detail, the field electrode 25 is drawn around in a helical shape surrounding the first potential region 11 in a plan view. The field electrode 25 has an inner end portion 26 on the drain region 15 side, an outer end portion 27 on the body region 16 side, and a helical portion 28 that extends between the inner end portion 26 and the outer end portion 27. The arrangement of the inner end portion 26 and of the outer end portion 27 is arbitrary.

In this embodiment, the inner end portion 26 is formed in the innermost first line portion 25*a*. In this embodiment, the inner end portion 26 is formed in a position that faces the drain region 15 in the second direction Y. The inner end portion 26 may face at least one among the well region 14, the drain region 15, and the plurality of RESURF regions 21 across the field insulating film 22.

In this embodiment, the outer end portion 27 is formed in the outermost first line portion 25*a*. In this embodiment, the outer end portion 27 is formed in a position that faces the source region 17 in the second direction Y. The outer end portion 27 may face at least one of both the drift exposed region 13*a* and the plurality of RESURF regions 21 across the field insulating film 22.

The helical portion 28 is formed by the plurality of first line portions 25*a* and by the plurality of second line portions 25*b*. In this embodiment, the helical portion 28 is formed in an elliptic helical shape that is wound around outwardly from the inner end portion 26 toward the outer end portion 27 so as to surround the drain region 15 in a plan view. The helical portion 28 faces the drift exposed region 13*a* and the plurality of RESURF regions 21 across the field insulating film 22.

The field electrode 25 has a structure that generates a voltage drop in a helical direction from the inner end portion 26 toward the outer end portion 27. In other words, the field electrode 25 forms a potential gradient that gradually decreases from the first potential region 11 toward the second potential region 12 by means of a potential according to the voltage drop with respect to a direction perpendicular to the helical direction. The field electrode 25 thins an electric field within the drift region 13, and suppresses a bias in electric field distribution in the drift region 13.

The field electrode 25 has a line width W (see FIG. 5). The line width W is a width in a direction perpendicular to an extending direction (i.e., helical direction) of the field electrode 25. The line width W may be not less than 0.5 μm and not more than 3 μm. Preferably, the line width W is not less than 0.8 μm and not more than 2 μm. The line width W may be equal to or more than the second length L2 of the RESURF region 21 ($L2 \leq W$), or may be less than the second length L2 ($L2 > W$). In this embodiment, the line width W is substantially equal to the second length L2 of each of the RESURF regions 21 ($L2 \approx W$).

The field electrode 25 may be formed with a substantially constant line width W in the linear portion (first line portion 25*a*) and in the circular arc portion (second line portion 25*b*). Additionally, for example, if the width of the drift region 13 gradually increases toward the middle of the circular arc portion, the line width W of the field electrode 25 (second line portion 25*b*) may gradually increase from the linear portion (first line portion 25*a*) toward the middle of the circular arc portion.

The resistance value of the field electrode 25 may be not less than 10 MΩ and not more than 100 MΩ. The pitch of the field electrode 25 may be not less than 1.5 μm and not more than 10 μm. The pitch of the field electrode 25 is a distance between mutually-adjoining two first line portions 25*a* (second line portions 25*b*) (i.e., a winding pitch of the helical portion 28).

Preferably, the pitch of the field electrode 25 is equal to or more than 2 μm. The number of winding turns of the field electrode 25 may be not less than 5 and not more than 50. The line width W, the resistance value, the pitch, and the number of winding turns of the field electrode 25 are arbitrary, and are adjusted in accordance with an electric field to be relaxed or in accordance with the layout of the plurality of RESURF arrays 20.

The semiconductor device 1A includes an inner field electrode 29 arranged in a region at the more inward side than the field electrode 25 on the field insulating film 22. In this embodiment, the inner field electrode 29 is formed in a region surrounded by the field electrode 25, and is fixed at the same electric potential as the first potential region 11 (drain region 15). The inner field electrode 29 has a thickness equal to that of the field electrode 25, and includes the same material (i.e., conductive polysilicon) as the field electrode 25.

The inner field electrode 29 is arranged in a region between the drain region 15 and the field electrode 25 at an interval from the drain region 15 and from the field electrode 25 in a plan view. In this embodiment, the inner field electrode 29 is formed in an annular shape (in detail, oval annular shape) surrounding the drain region 15.

The inner field electrode 29 may face the well region 14 across the field insulating film 22. Preferably, the inner field electrode 29 is formed at an interval from the plurality of RESURF regions 21 toward the drain region 15 side in a plan view. As a matter of course, the inner field electrode 29 may cover at least one part of the plurality of RESURF regions 21 included in the innermost RESURF array 20.

The inner field electrode 29 includes an inner edge portion 29*a* and an outer edge portion 29*b*. Preferably, the inner edge portion 29*a* is formed with a substantially constant interval between the inner edge portion 29*a* and the drain region 15. Preferably, the outer edge portion 29*b* is formed with a substantially constant interval between the outer edge portion 29*b* and the field electrode 25. Preferably, the distance between the inner field electrode 29 and the field electrode 25 is equal to the pitch of the field electrode 25.

In this embodiment, the inner field electrode 29 is formed with a non-constant width along a circumferential direction.

In detail, the inner field electrode 29 has a field projection portion 30 in the outer edge portion 29*b*. The field projection portion 30 projects toward the field electrode 25 so as to become close to a front end of the inner end portion 26 of the field electrode 25. The field projection portion 30 maintains a distance between the inner field electrode 29 and the field electrode 25 substantially fixedly, and suppresses a bias in electric field caused by the inner end portion 26 of the field electrode 25.

In this embodiment, the inner field electrode 29 is connected to the field electrode 25, and is fixed at the same electric potential as the inner end portion 26. In detail, the field projection portion 30 is connected to the front end of the inner end portion 26. If it is possible to fix both the inner field electrode 29 and the inner end portion 26 at the same electric potential, the inner field electrode 29 is not necessarily required to be connected to the inner end portion 26. Therefore, the inner field electrode 29 may face the front end of the inner end portion 26 in the helical direction of the field electrode 25. Additionally, the presence or absence of the inner field electrode 29 is arbitrary, and may be removed if necessary.

The line width of the inner field electrode 29 may be not less than 1 μm and not more than 15 μm. Preferably, the inner field electrode 29 is formed wider than the field electrode 25. Preferably, the line width of the inner field electrode 29 is not less than 1.5 times and not more than 5 times as wide as the line width W of the field electrode 25. As a matter of course, the inner field electrode 29 having a line width equal to or less than the line width W may be formed.

Referring to FIG. 3 and FIG. 4, the semiconductor device 1A includes a gate insulating film 31 covering the channel region 18 on the first main surface 3. The gate insulating film 31 has a thickness less than the thickness of the field insulating film 22, and is connected to the field insulating film 22 (outer edge portion 22*b*). The thickness of the gate insulating film 31 may be not less than 10 nm and not more than 200 nm. In this embodiment, the gate insulating film 31 is made of silicon oxide. The gate insulating film 31 is formed in a belt shape extending along the channel region 18 in a plan view, and exposes the source region 17 and the contact region 19.

In this embodiment, the gate insulating film 31 is formed in an annular shape (in detail, oval annular shape) surrounding the field insulating film 22 in a plan view. The gate insulating film 31 covers the drift region 13 (drift exposed region 13*a*) in a region between the inner edge of the body region 16 and the outer edge portion 22*b* of the field insulating film 22. The gate insulating film 31 may cover at least one part of the plurality of RESURF regions 21 (outermost RESURF array 20).

The semiconductor device 1A includes a gate electrode 32 arranged on the gate insulating film 31. The gate electrode 32 has a thickness substantially equal to that of the field electrode 25, and includes the same material as the field electrode 25 (i.e., conductive polysilicon). The gate electrode 32 may include either one or both of an n-type region and a p-type region in the conductive polysilicon.

The gate electrode 32 faces the drift region 13 (drift exposed region 13*a*) and the channel region 18 across the gate insulating film 31. The gate electrode 32 may face at least one part of the plurality of RESURF regions 21 (outermost RESURF array 20) across the gate insulating film 31.

The gate electrode 32 is formed in a belt shape extending along the field insulating film 22 in a plan view. In this embodiment, the gate electrode 32 is formed in an annular shape (in detail, oval annular shape) surrounding the field insulating film 22 in a plan view. The gate electrode 32 has a lead-out portion 33 that has been led out from above the gate insulating film 31 onto the field insulating film 22. The lead-out portion 33 is formed in an annular shape (in detail, oval annular shape) surrounding the field electrode 25 at an interval from the field electrode 25.

The lead-out portion 33 faces the drift exposed region 13*a* (drift region 13) across the field insulating film 22. In this embodiment, the lead-out portion 33 faces the plurality of RESURF regions 21 across the field insulating film 22. Preferably, the lead-out portion 33 is formed with a substantially constant interval between the lead-out portion 33 and the field electrode 25. Preferably, the distance between the lead-out portion 33 and the field electrode 25 is equal to the pitch of the field electrode 25.

The gate electrode 32 includes a gate inner edge portion 32*a* and a gate outer edge portion 32*b*. The gate inner edge portion 32*a* is formed by the lead-out portion 33. Preferably, the gate inner edge portion 32*a* is formed with a substantially constant interval between the gate inner edge portion 32*a* and the field electrode 25. Preferably, the distance between the gate electrode 32 and the field electrode 25 is equal to the pitch of the field electrode 25. The gate outer edge portion 32*b* is formed in a region in which the gate outer edge portion 32*b* coincides with the body region 16 in a plan view. Preferably, the gate outer edge portion 32*b* is formed with a substantially constant interval between the gate outer edge portion 32*b* and the outer edge portion of the field insulating film 22.

In this embodiment, the gate electrode 32 is formed with a non-constant width along a circumferential direction. In detail, the gate electrode 32 has a gate projection portion 34 that projects toward the first potential region 11 side in the lead-out portion 33. The gate projection portion 34 projects toward the field electrode 25 so as to become close to a front end of the outer end portion 27 in the helical direction of the field electrode 25. The gate projection portion 34 faces the front end of the outer end portion 27 in the helical direction of the field electrode 25. The gate projection portion 34 maintains a distance between the gate electrode 32 and the field electrode 25 substantially fixedly, and suppresses a bias in electric field caused by the outer end portion 27 of the field electrode 25.

Referring to FIG. 4, the semiconductor device 1A includes an insulating layer 40 covering the transistor region 9 on the first main surface 3. The insulating layer 40 consists of a multilayer wiring structure having a layered structure in which a plurality of interlayer insulating films 41 and a plurality of wiring films 42 are alternately stacked together. The number of stacked layers of the interlayer insulating film 41 and the wiring films 42 is arbitrary, and is not limited to a specific numerical value. The multilayer wiring structure may have a layered structure in which three or more interlayer insulating films 41 and three or more wiring films 42 are alternately stacked together. In this embodiment, the plurality of interlayer insulating films 41 include first and second interlayer insulating layers 41A and 41B, and the plurality of wiring films 42 include first and second wiring films 42A and 42B.

Each of the interlayer insulating films 41 includes at least one of a silicon oxide film and a silicon nitride film. Each of the interlayer insulating films 41 may have a single-layer structure consisting of a silicon oxide film or a silicon nitride film. Each of the interlayer insulating films 41 may have a layered structure in which at least one silicon oxide film and at least one silicon nitride film are stacked together in an arbitrary order. Each of the wiring films 42 may include at least one among an Al film, a Cu film, an AlSiCu alloy film, an AlSi alloy film, and an AlCu alloy film.

The plurality of first wiring films 42A are arranged on the first interlayer insulating film 41A. The plurality of first wiring films 42A are each electrically connected to a corresponding to-be-connected object through a single or a plurality of first via electrodes 43 passing through the first interlayer insulating film 41A. The first via electrode 43 may be a tungsten plug electrode. In detail, the plurality of first wiring films 42A include a first drain wiring 44, a first source wiring 45, a first gate wiring 46, an inner field wiring 47, and an outer field wiring 48.

The first drain wiring 44 is electrically connected to the drain region 15 through the single or the plurality of first via electrodes 43. The first source wiring 45 is electrically connected to the source region 17 (body region 16 and contact region 19) through the single or the plurality of first via electrodes 43. The first gate wiring 46 is electrically connected to the gate electrode 32 through the single or the plurality of first via electrodes 43.

The inner field wiring 47 is electrically connected to the inner end portion 26 of the field electrode 25 through the single or the plurality of first via electrodes 43. The inner field wiring 47 may be electrically connected to the inner field electrode 29 through the single or the plurality of first via electrodes 43. The inner field wiring 47 may be integrally formed with the first drain wiring 44. The outer field wiring 48 is electrically connected to the outer end portion 27 of the field electrode 25 through the single or the plurality of first via electrodes 43. The outer field wiring 48 may be integrally formed with the first source wiring 45.

The plurality of second wiring films 42B are arranged on the second interlayer insulating film 41B. The plurality of second wiring films 42B are each electrically connected to a corresponding to-be-connected object through a single or a plurality of second via electrodes 49 passing through the second interlayer insulating film 41B. The second via electrode 49 may be a tungsten plug electrode. In detail, the plurality of second wiring films 42B include a second drain wiring 50, a second source wiring 51, and a second gate wiring (not shown).

The second drain wiring 50 is electrically connected to the first drain wiring 44 and to the inner field wiring 47 through the plurality of second via electrodes 49. The second drain wiring 50 covers the drain region 15 and the inner field wiring 47 in a plan view. Preferably, the second drain wiring 50 covers the entire area of the drain region 15 and the entire area of the inner field wiring 47 in a plan view.

Preferably, the second drain wiring 50 is led out to a position that faces the inner field electrode 29 in a plan view. Particularly preferably, the second drain wiring 50 is led out to a position that faces the innermost first line portion 25*a* of the field electrode 25 (innermost RESURF array 20) in a plan view.

The second source wiring 51 is electrically connected to the first source wiring 45 and to the outer field wiring 48 through the plurality of second via electrodes 49. The second source wiring 51 is formed in an annular shape extending along the body region 16 in a plan view. Preferably, the second source wiring 51 covers the gate electrode 32 and the outer field wiring 48 in a plan view.

Preferably, the second source wiring 51 covers the entire area of the body region 16, the entire area of the gate electrode 32, and the entire area of the outer field wiring 48 in a plan view. Particularly preferably, the second source wiring 51 is led out to a position that faces the outermost first line portion 25*a* of the field electrode 25 (outermost RESURF array 20) in a plan view.

Other layout examples of both the RESURF array 20 and the field electrode 25 are hereinafter shown. FIG. 6A to FIG. 6L are plan views each of which shows second to thirteenth layout examples of both the RESURF array 20 and the field electrode 25 shown in FIG. 3. For clarity, the plurality of RESURF regions 21 are shown by hatching, and the field electrode 25 is shown by a thick line in FIG. 6A to FIG. 6L.

Figure 6A:
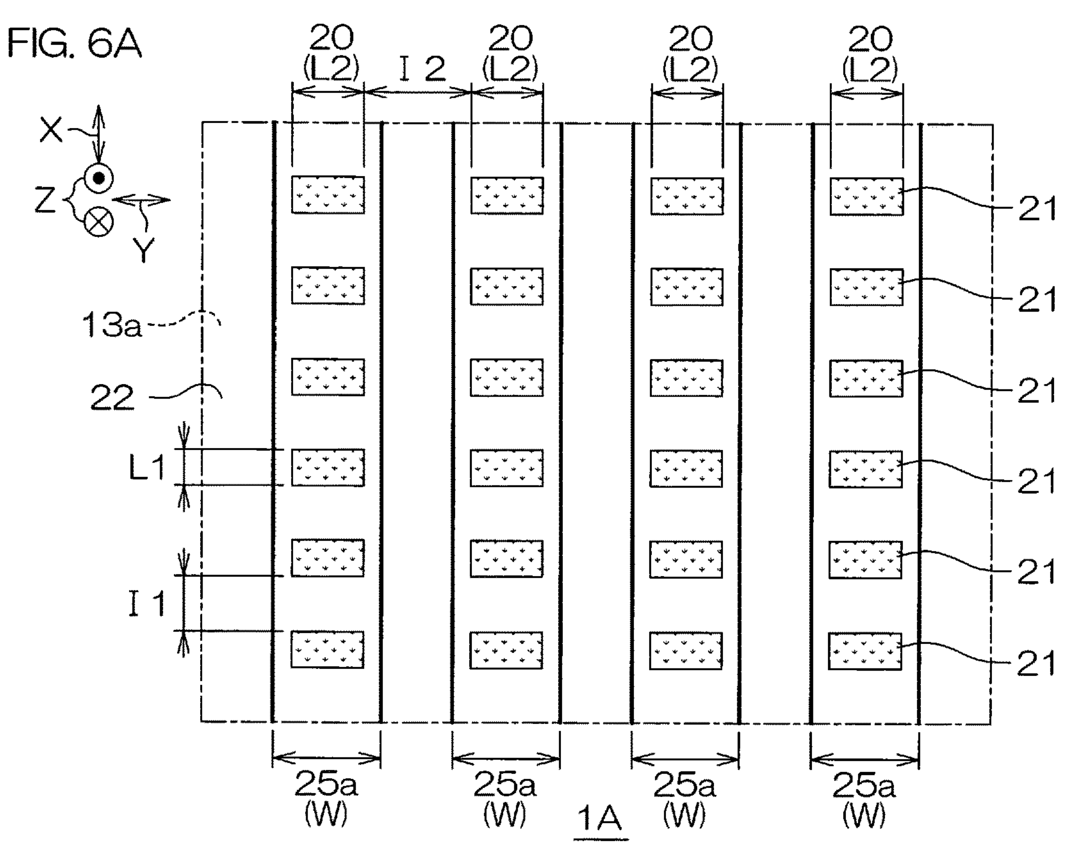
FIG. 6A is a plan view showing a second layout example of the RESURF array and the field electrode shown in FIG. 3.

Referring to FIG. 6A, at least one (in this embodiment, plurality of) first line portion 25*a* may cover the entire area of each of the plurality of RESURF regions 21 so as to project from the first end portion of the plurality of RESURF regions 21 (first potential region 11 side) toward the first potential region 11 side and so as to project from the second end portion of the plurality of RESURF regions 21 (second potential region 12 side) toward the second potential region 12 side. In other words, at least one (in this embodiment, plurality of) first line portion 25*a* may have a line width W ($L2<W$) exceeding the second length L2 of a corresponding one of the RESURF regions 21.

Figure 6B:
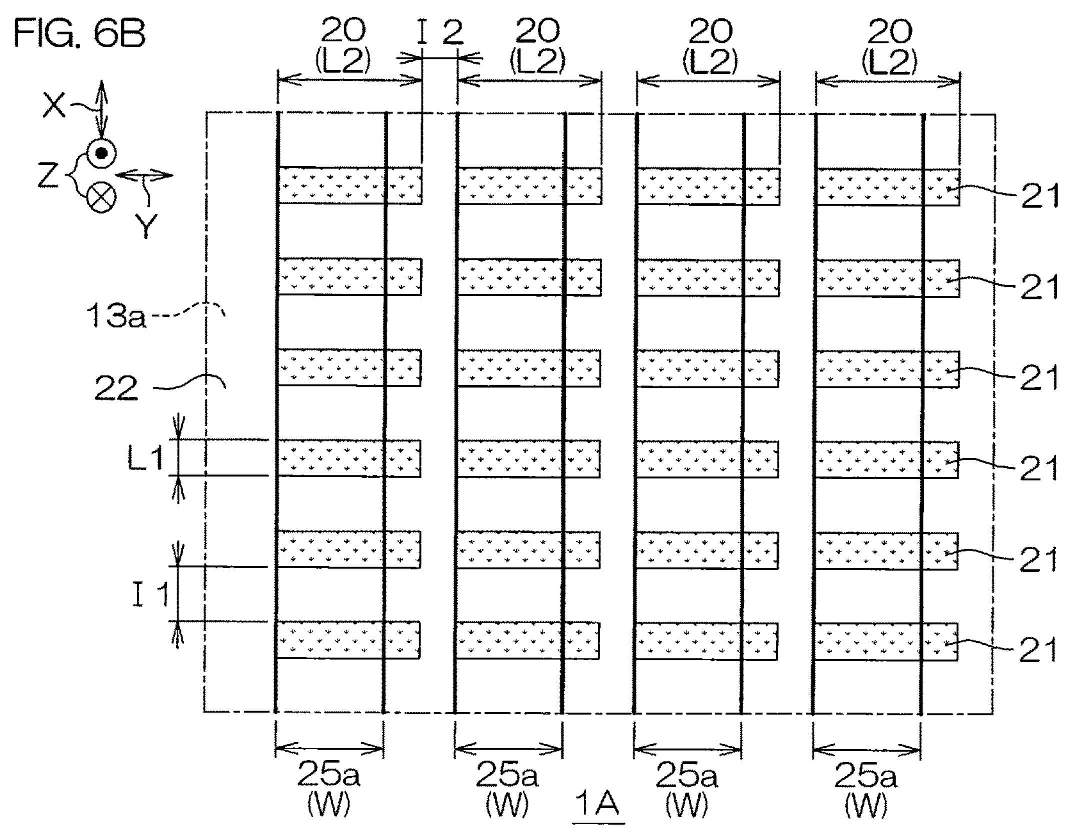
FIG. 6B is a plan view showing a third layout example of the RESURF array and the field electrode shown in FIG. 3.

Referring to FIG. 6B, at least one (in this embodiment, plurality of) first line portion 25*a* may cover a part of each of the plurality of RESURF regions 21 so as to expose the first end portion of the plurality of RESURF regions 21 and so as to cover the second end portion of the plurality of RESURF regions 21. At least one (in this embodiment, plurality of) first line portion 25*a* may have a line width W ($L2>W$) less than the second length L2 of the corresponding RESURF region 21.

At least one (in this embodiment, plurality of) first line portion 25*a* may cover each of the plurality of RESURF regions 21 so as to project from the second end portion of the plurality of RESURF regions 21 toward the second potential region 12 side. An outer edge portion of at least one (in this embodiment, plurality of) first line portion 25*a* may be placed directly on the second end portion of the RESURF region 21 of the corresponding RESURF array 20.

Figure 6C:
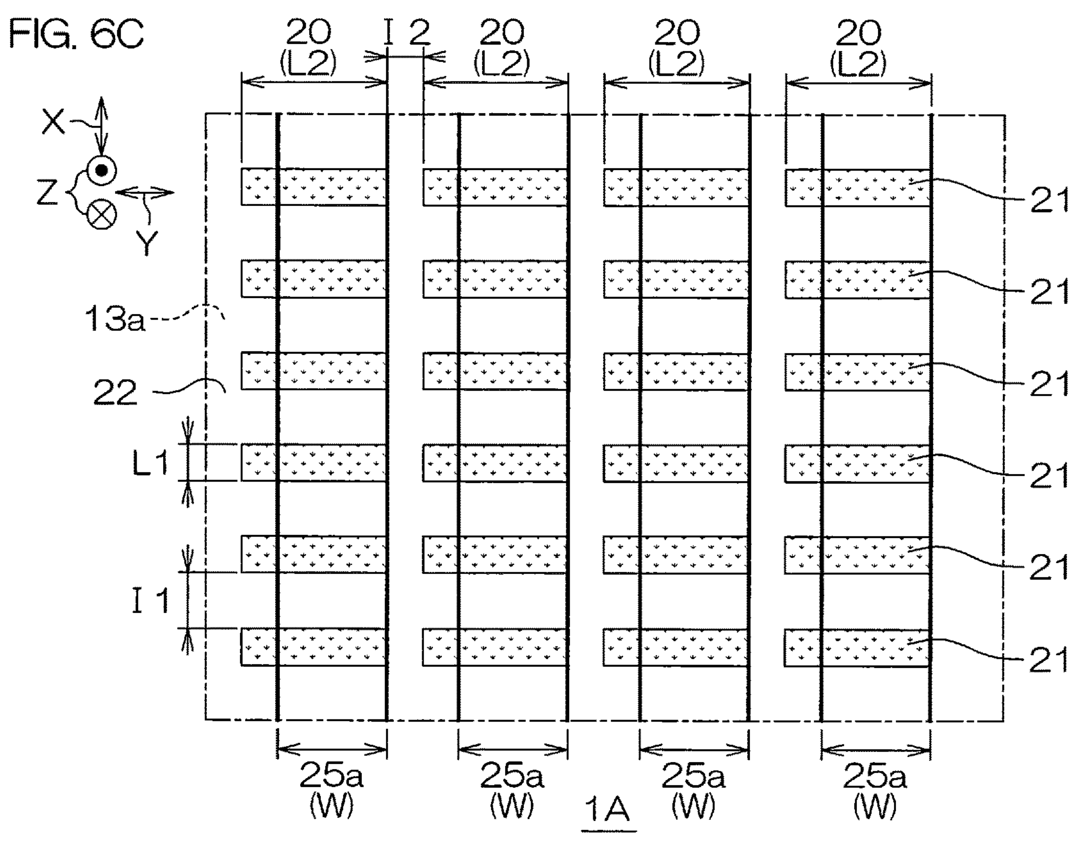
FIG. 6C is a plan view showing a fourth layout example of the RESURF array and the field electrode shown in FIG. 3.

Referring to FIG. 6C, at least one (in this embodiment, plurality of) first line portion 25*a* may cover a part of each of the plurality of RESURF regions 21 so as to cover the first end portion of the plurality of RESURF regions 21 and so as to expose the second end portion of the plurality of RESURF regions 21. At least one (in this embodiment, plurality of) first line portion 25*a* may have a line width W ($L2>W$) less than the second length L2 of the corresponding RESURF region 21.

At least one (in this embodiment, plurality of) first line portion 25*a* may cover each of the plurality of RESURF regions 21 so as to project from the first end portion of the plurality of RESURF regions 21 toward the first potential region 11 side. The outer edge portion of at least one (in this embodiment, plurality of) first line portion 25*a* may be placed directly on the first end portion of the RESURF region 21 of the corresponding RESURF array 20.

Figure 6D:
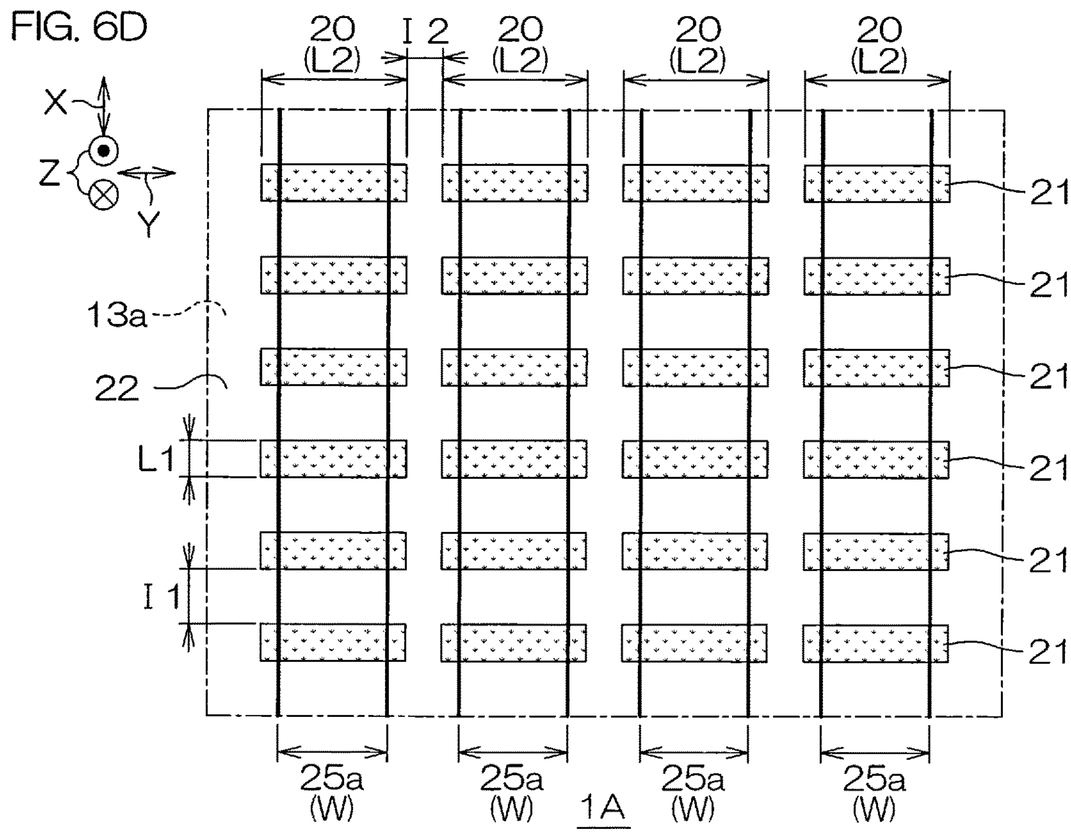
FIG. 6D is a plan view showing a fifth layout example of the RESURF array and the field electrode shown in FIG. 3.

Referring to FIG. 6D, at least one (in this embodiment, plurality of) first line portion 25*a* may cover a part of each of the plurality of RESURF regions 21 so as to expose the first and second end portions of the plurality of RESURF regions 21 and so as to cover an internal portion of the plurality of RESURF regions 21. At least one (in this embodiment, plurality of) first line portion 25*a* may have a line width W ($L2>W$) less than the second length L2 of the corresponding RESURF region 21.

Figure 6E:
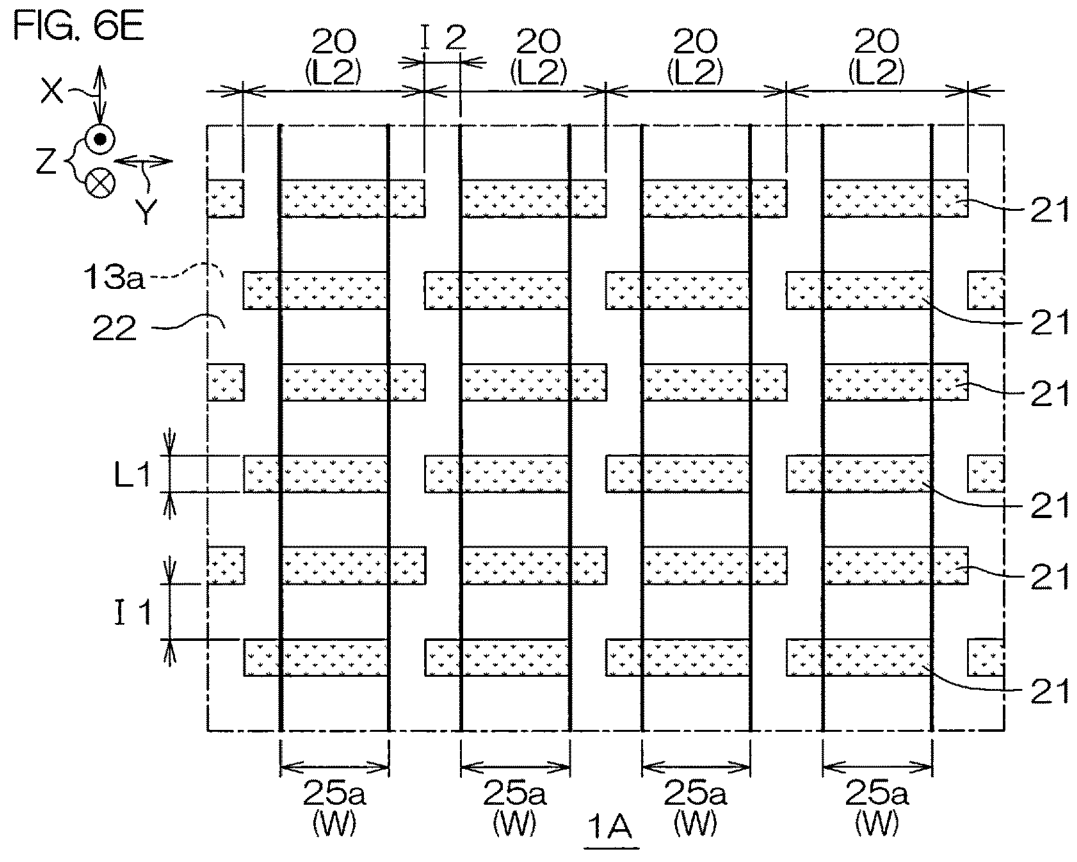
FIG. 6E is a plan view showing a sixth layout example of the RESURF array and the field electrode shown in FIG. 3.

Referring to FIG. 6E, at least one (in this embodiment, plurality of) RESURF array 20 may include the plurality of RESURF regions 21 that are arranged so as to mutually deviate in the second direction Y so that their relative positions in the second direction Y differ from each other. In detail, the plurality of RESURF regions 21 each include a plurality of first RESURF regions 21*a* and a plurality of second RESURF regions 21*b* alternately arranged in the first direction X.

A first end portion of the plurality of second RESURF regions 21*b* is placed in a region on the second potential region 12 side with respect to a first end portion of the plurality of first RESURF regions 21*a*. A second end portion of the plurality of second RESURF regions 21*b* is placed in a region on the second potential region 12 side with respect to a second end portion of the plurality of first RESURF regions 21*a*.

The first end portions of the plurality of first RESURF regions 21*a* may be placed on the same straight line extending in the first direction X, or may be placed on different straight lines. The second end portions of the plurality of first RESURF regions 21*a* may be placed on the same straight line extending in the first direction X, or may be placed on different straight lines. The first end portions of the plurality of second RESURF regions 21*b* may be placed on the same straight line extending in the first direction X, or may be placed on different straight lines. The second end portions of the plurality of second RESURF regions 21*b* may be placed on the same straight line extending in the first direction X, or may be placed on different straight lines.

In this case, at least one (in this embodiment, plurality of) first line portion 25*a* may cover a part of each of the plurality of RESURF regions 21 so as to cover the first end portion of the plurality of first RESURF regions 21*a* and the second end portion of the plurality of second RESURF regions 21*b* and so as to expose the second end portion of the plurality of first RESURF regions 21*a* and the first end portion of the plurality of second RESURF regions 21*b*. At least one (in this embodiment, plurality of) first line portion 25*a* may have a line width W (L2>W) less than the second length L2 of the corresponding RESURF region 21.

At least one (in this embodiment, plurality of) first line portion 25*a* may cover each of the plurality of first RESURF regions 21*a* so as to project from the second end portion of the plurality of first RESURF regions 21*a* toward the second potential region 12 side. Additionally, at least one (in this embodiment, plurality of) first line portion 25*a* may cover each of the plurality of second RESURF regions 21*b* so as to project from the first end portion of the plurality of second RESURF regions 21*b* toward the first potential region 11 side.

The outer edge portion of at least one (in this embodiment, plurality of) first line portion 25*a* may be placed directly on the second end portion of the first RESURF region 21*a* of the corresponding RESURF array 20. The inner edge portion of at least one (in this embodiment, plurality of) first line portion 25*a* may be placed directly on the second end portion of the second RESURF region 21*b* of the corresponding RESURF array 20.

As a matter of course, at least one first line portion 25*a* may cover each of the plurality of RESURF regions 21 so as to cover the second end portion of the plurality of first RESURF regions 21*a* and the first end portion of the plurality of second RESURF regions 21*b* and so as to expose the first end portion of the plurality of first RESURF regions 21*a* and the second end portion of the plurality of second RESURF regions 21*b*.

Figure 6F:
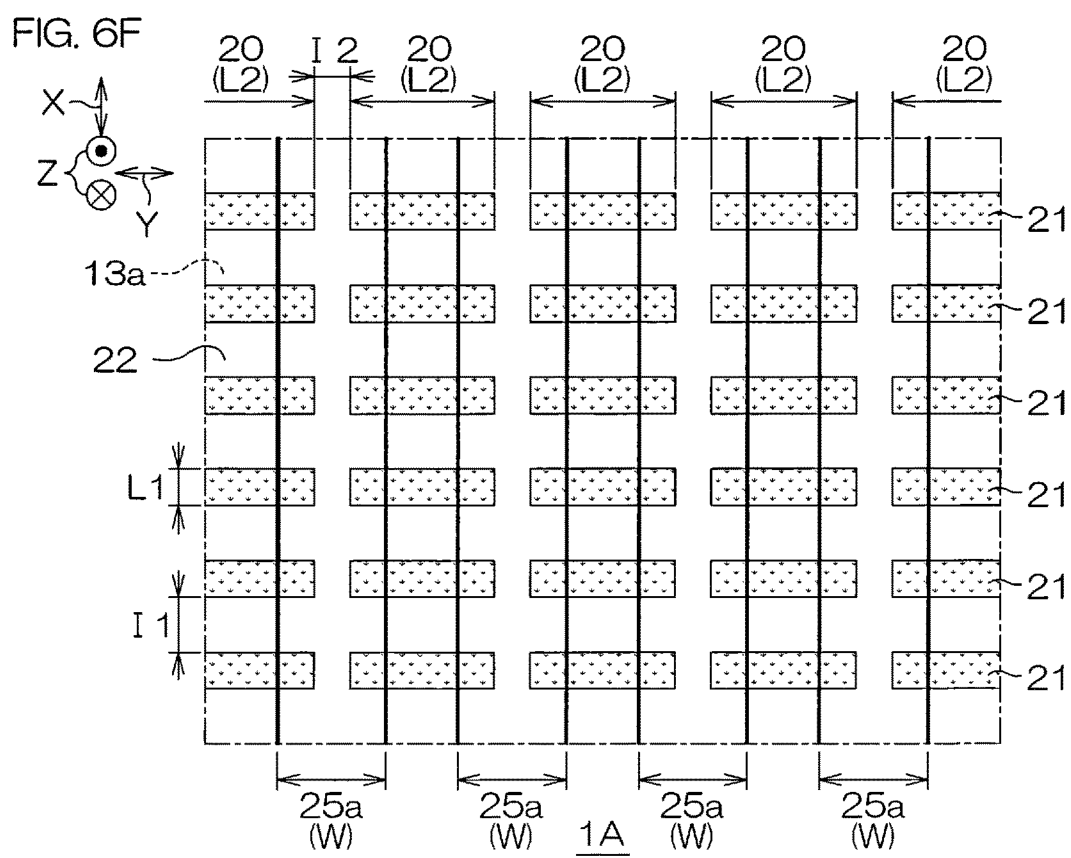
FIG. 6F is a plan view showing a seventh layout example of the RESURF array and the field electrode shown in FIG. 3.

Referring to FIG. 6F, at least one (in this embodiment, plurality of) first line portion 25*a* may cover a region between mutually-adjoining plurality of RESURF arrays 20 so as to partially cover the mutually-adjoining plurality of RESURF arrays 20. At least one (in this embodiment, plurality of) first line portion 25*a* may have a line width W (L2>W) less than the second length L2 of the corresponding RESURF region 21.

In this embodiment, at least one (in this embodiment, plurality of) first line portion 25*a* covers the second end portion of each of the plurality of RESURF regions 21 of the RESURF array 20 on one side (first potential region 11 side) and the first end portion of each of the plurality of RESURF regions 21 of the RESURF array 20 on the other side (second potential region 12 side). In other words, each of the first line portions 25*a* is placed directly on a plurality of cross portions extending in the first and second directions X and Y in the drift exposed region 13*a* in a plan view, and exposes a stripe portion of the drift exposed region 13*a*.

Figure 6G:
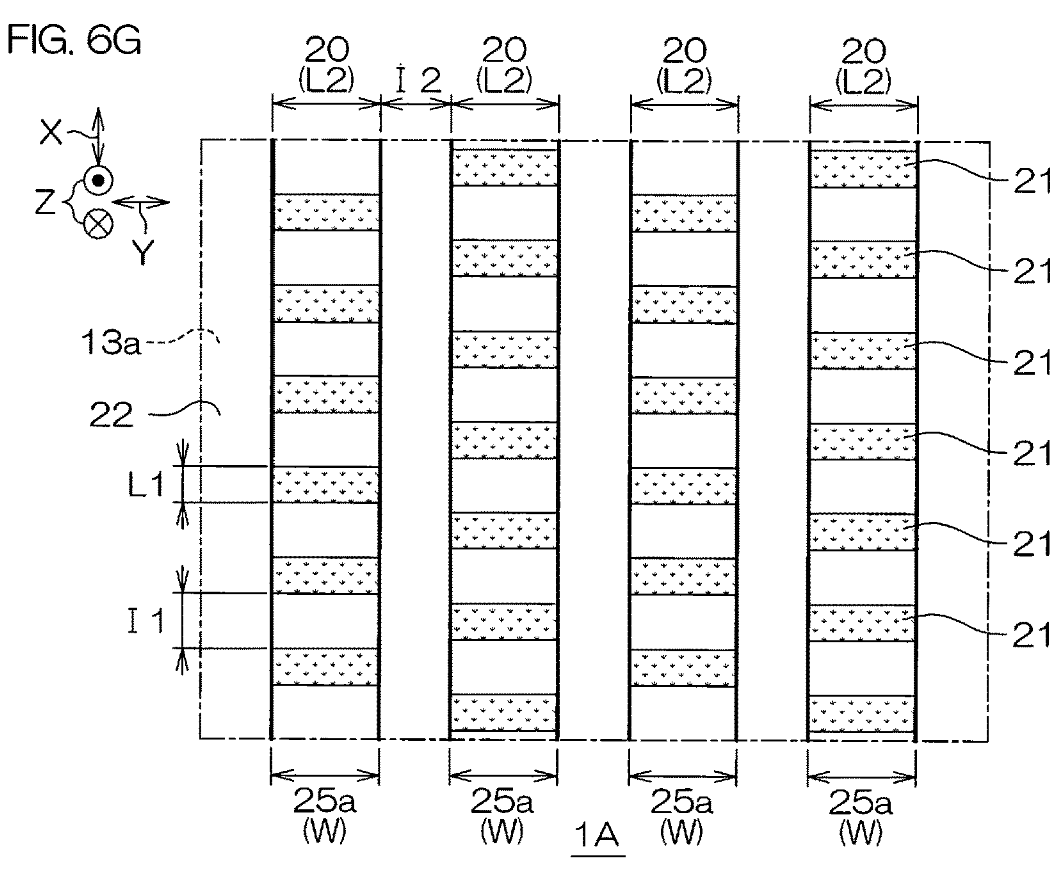
FIG. 6G is a plan view showing an eighth layout example of the RESURF array and the field electrode shown in FIG. 3.

Referring to FIG. 6G, the plurality of RESURF regions 21 of at least one (in this embodiment, plurality of) RESURF array 20 may be arranged so as to deviate in the first direction X with respect to the plurality of RESURF regions 21 of the adjoining RESURF array 20. In other words, the plurality of RESURF regions 21 according to the plurality of RESURF arrays 20 may be arranged in a staggered form with intervals therebetween in the first and second directions X and Y. In this embodiment, the plurality of RESURF regions 21 of each of the RESURF arrays 20 are arranged so as to deviate in the first direction X so as not to face the plurality of RESURF regions 21 of the adjoining RESURF array 20 in the second direction Y.

Figure 6H:
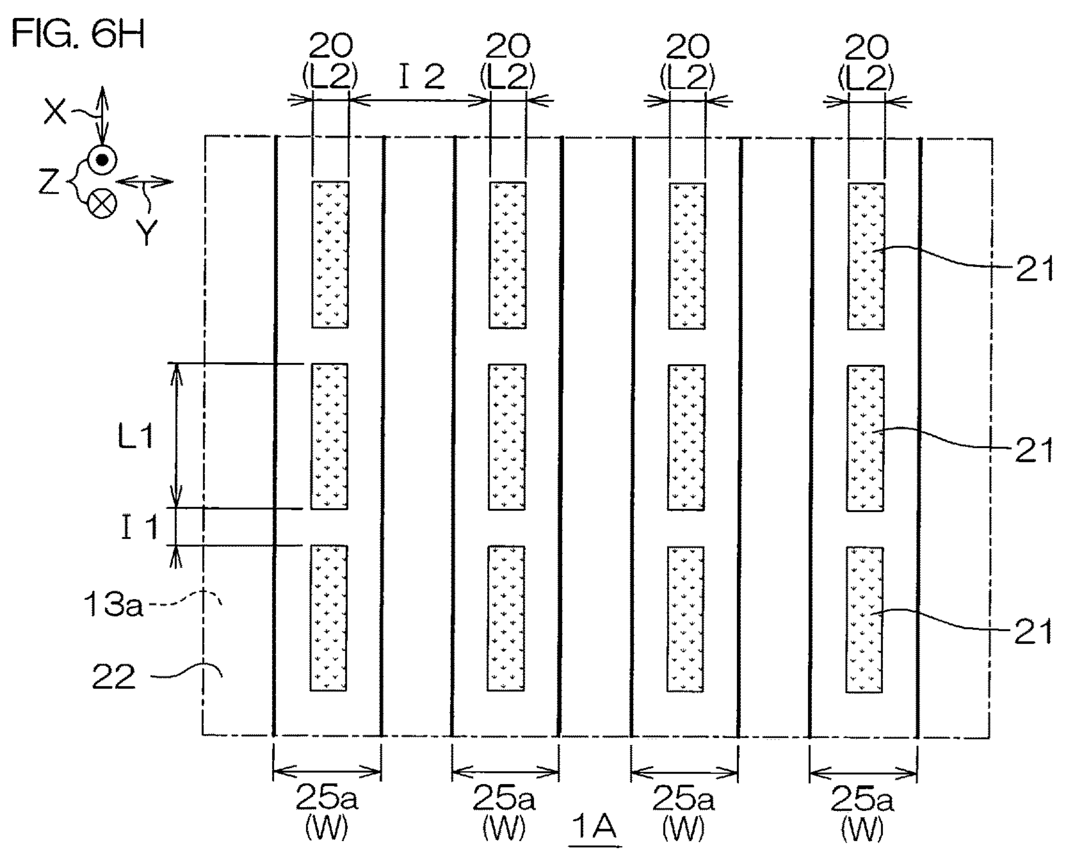
FIG. 6H is a plan view showing a ninth layout example of the RESURF array and the field electrode shown in FIG. 3.

Referring to FIG. 6H, at least one (in this embodiment, plurality of) RESURF array 20 may include the plurality of RESURF regions 21 each of which is formed in a belt shape extending in the first direction X. At least one (in this embodiment, plurality of) first line portion 25*a* may extend in a belt shape along the corresponding plurality of RESURF regions 21 (RESURF array 20) so as to cover the plurality of RESURF regions 21.

Figure 6I:
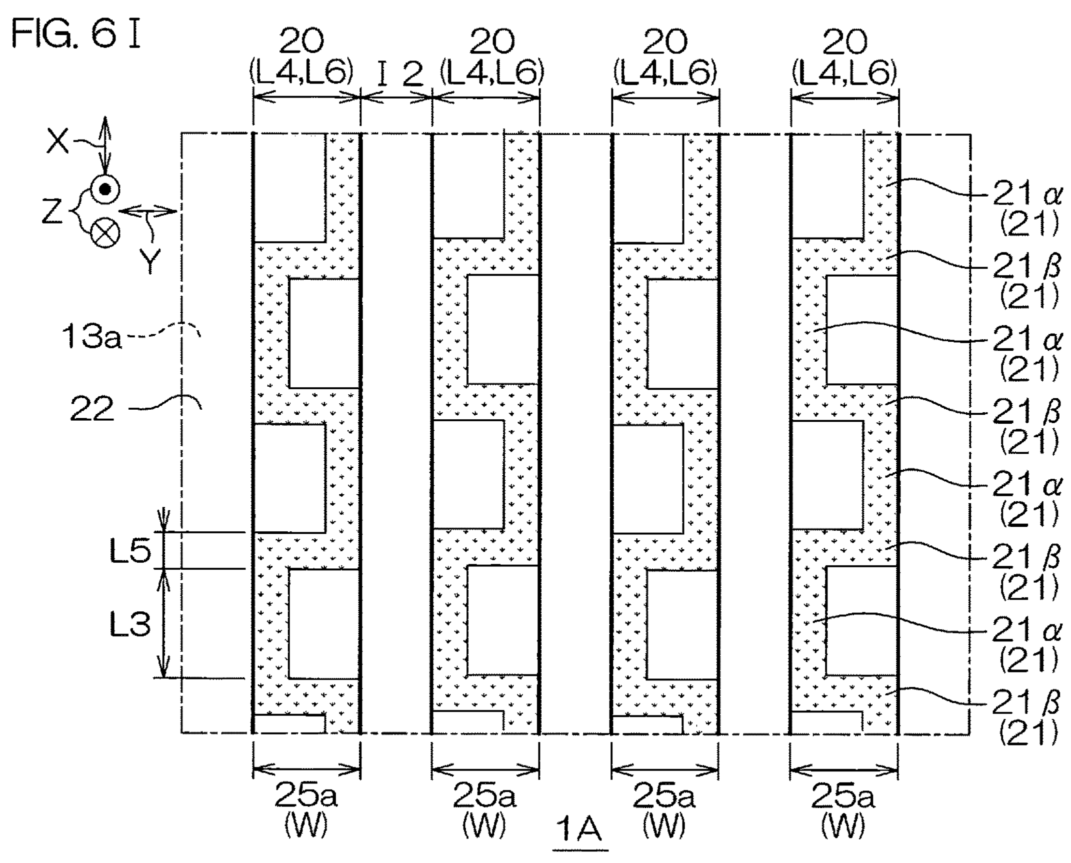
FIG. 6I is a plan view showing a tenth layout example of the RESURF array and the field electrode shown in FIG. 3.

Referring to FIG. 6I, at least one (in this embodiment, plurality of) RESURF array 20 may include at least one (in this embodiment, plurality of) first RESURF region 21α extending in the first direction X and at least one (in this embodiment, plurality of) second RESURF region 21β extending in the second direction Y. In this embodiment, each of the RESURF arrays 20 includes the plurality of first RESURF regions 21α and the plurality of second RESURF regions 21β alternately arranged in the first direction X.

The plurality of first RESURF regions 21α may have a third length L3 in the first direction X, and may have a fourth length L4 in the second direction Y. The plurality of second RESURF regions 21β may have a fifth length L5 in the first direction X, and may have a sixth length L6 in the second direction Y. The fifth length L5 may be equal to or more than the third length L3, or may be less than the third length L3. The sixth length L6 may be equal to or more than the fourth length L4, or may be less than the fourth length L4.

Each of the RESURF regions may include at least one RESURF region 21 in which the plurality of first RESURF regions 21α and the plurality of second RESURF regions 21β are united together in a meandering form in a plan view. At least one (in this embodiment, plurality of) first line portion 25*a* may extend in a belt shape along the corresponding RESURF array 20 so as to cover the plurality of first RESURF regions 21α and the plurality of second RESURF regions 21β.

Figure 6J:
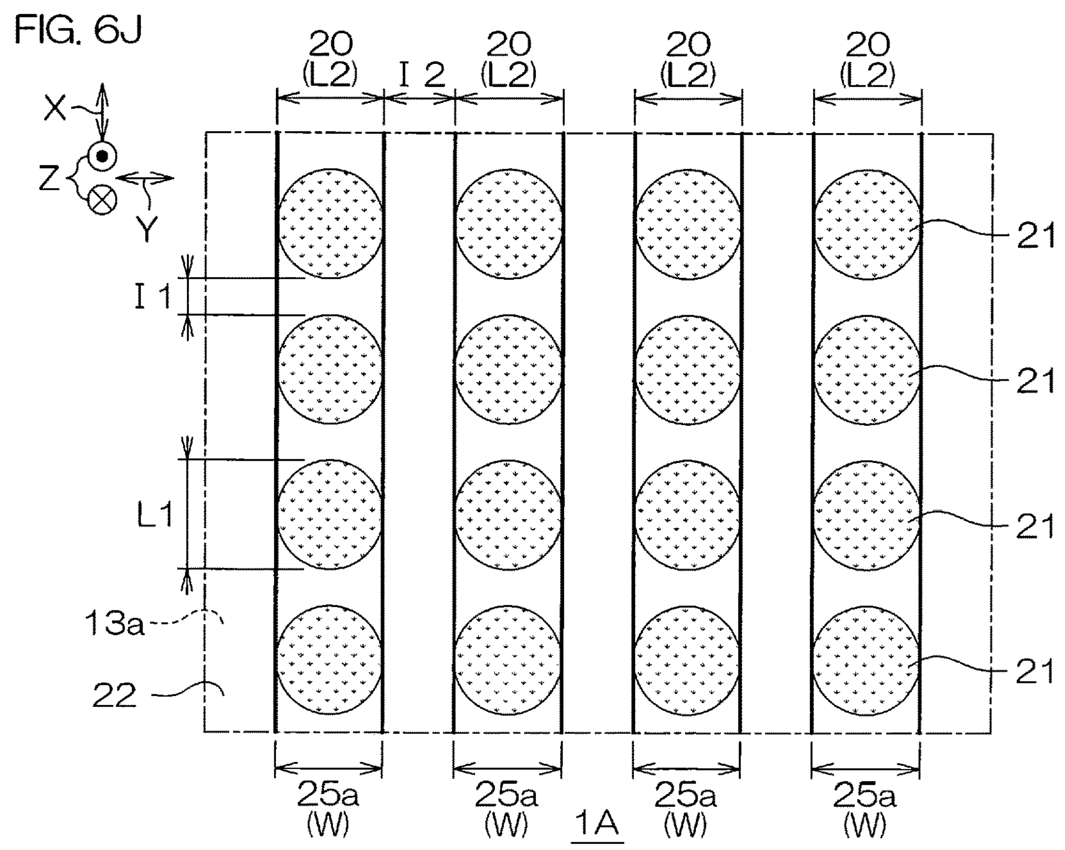
FIG. 6J is a plan view showing an eleventh layout example of the RESURF array and the field electrode shown in FIG. 3.

Referring to FIG. 6J, at least one (in this embodiment, plurality of) RESURF array 20 may include at least one (in this embodiment, plurality of) RESURF region 21 formed in a shape other than the belt shape in a plan view. In this embodiment, the plurality of RESURF regions 21 are formed in a circular shape in a plan view. The plurality of RESURF regions 21 may be formed in a polygonal shape or an elliptical shape other than the quadrangular shape in a plan view.

Figure 6K:
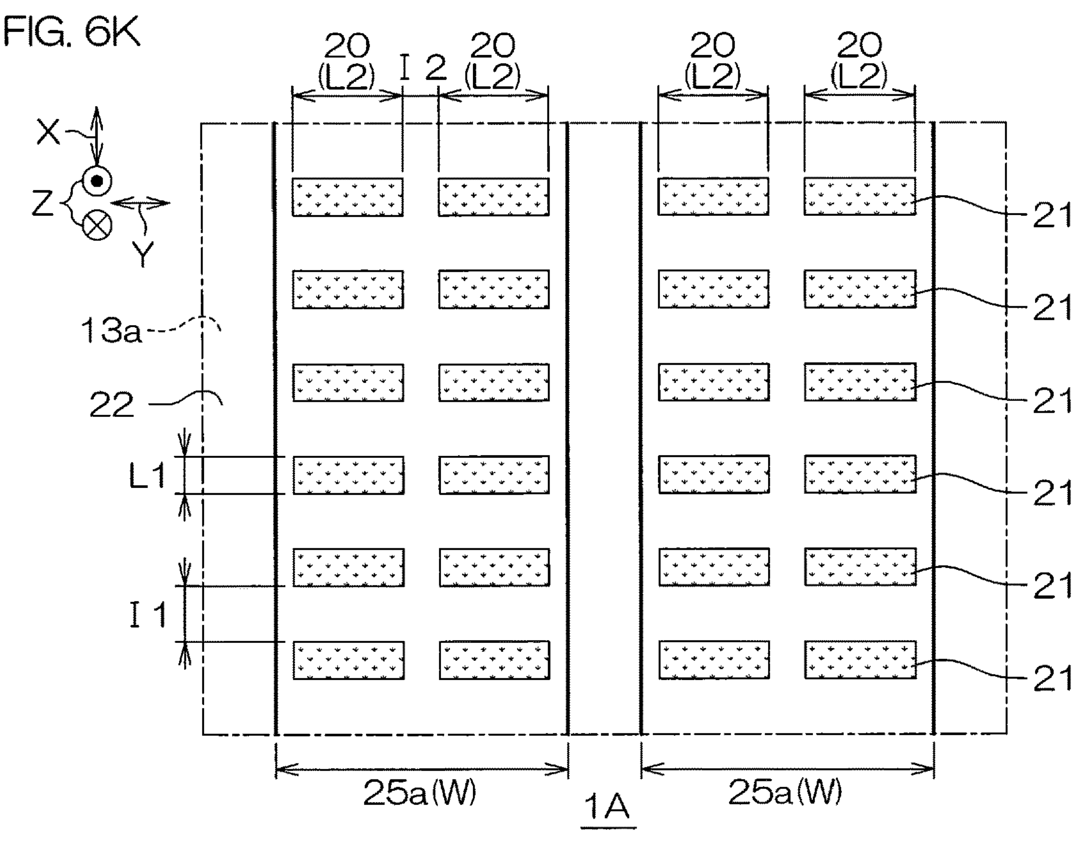
FIG. 6K is a plan view showing a twelfth layout example of the RESURF array and the field electrode shown in FIG. 3.

Referring to FIG. 6K, at least one (in this embodiment, plurality of) first line portion 25*a* may cover a plurality of (two or more) RESURF arrays 20. Preferably, at least one (in this embodiment, plurality of) first line portion 25*a* covers three or less RESURF arrays 20. Particularly preferably, at least one (in this embodiment, plurality of) first line portion 25*a* covers only one RESURF array 20.

Figure 6L:
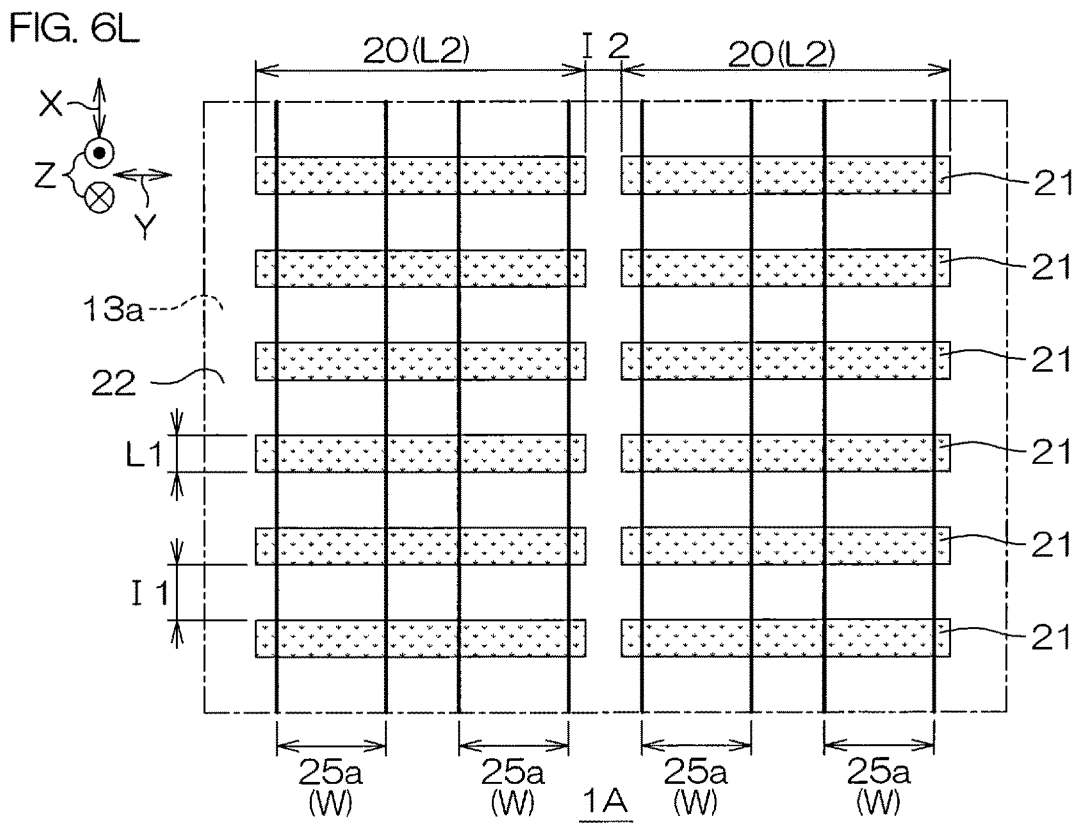
FIG. 6L is a plan view showing a thirteenth layout example of the RESURF array and the field electrode shown in FIG. 3.

Referring to FIG. 6L, the plurality of first line portions 25*a* may cover the single RESURF array 20. In other words, the field electrode 25 (helical portion 28) may cross the single RESURF array 20 multiple times. In this example, the field electrode 25 (helical portion 28) is drawn around so that two first line portions 25*a* cover the single RESURF array 20, and yet the field electrode 25 (helical portion 28) may be drawn around so that three or more first line portions 25*a* may cover the single RESURF array 20.

The layout of both the RESURF array 20 and the field electrode 25 is arbitrary although the first to thirteenth layout examples of both the RESURF array 20 and the field electrode 25 have been shown in FIG. 5 and FIG. 6A to FIG. 6L. The RESURF array 20 and the field electrode 25 may be formed in a layout other than the first to thirteenth layout examples. The RESURF array 20 and the field electrode 25 may be formed in a layout example in which at least two of the first to thirteenth layout examples are combined together.

In other words, any one or a plurality of among the first to thirteenth layout examples may be combined into any one among the first to thirteenth layout examples. In still other words, the form of any one or a plurality of RESURF arrays 20 of the first to thirteenth layout examples may be combined into the form of any one RESURF array 20 of the first to thirteenth layout examples. Additionally, the form of any one or a plurality of field electrodes 25 of the first to thirteenth layout examples may be combined into the form of any one field electrode 25 of the first to thirteenth layout examples.

Figure 7:
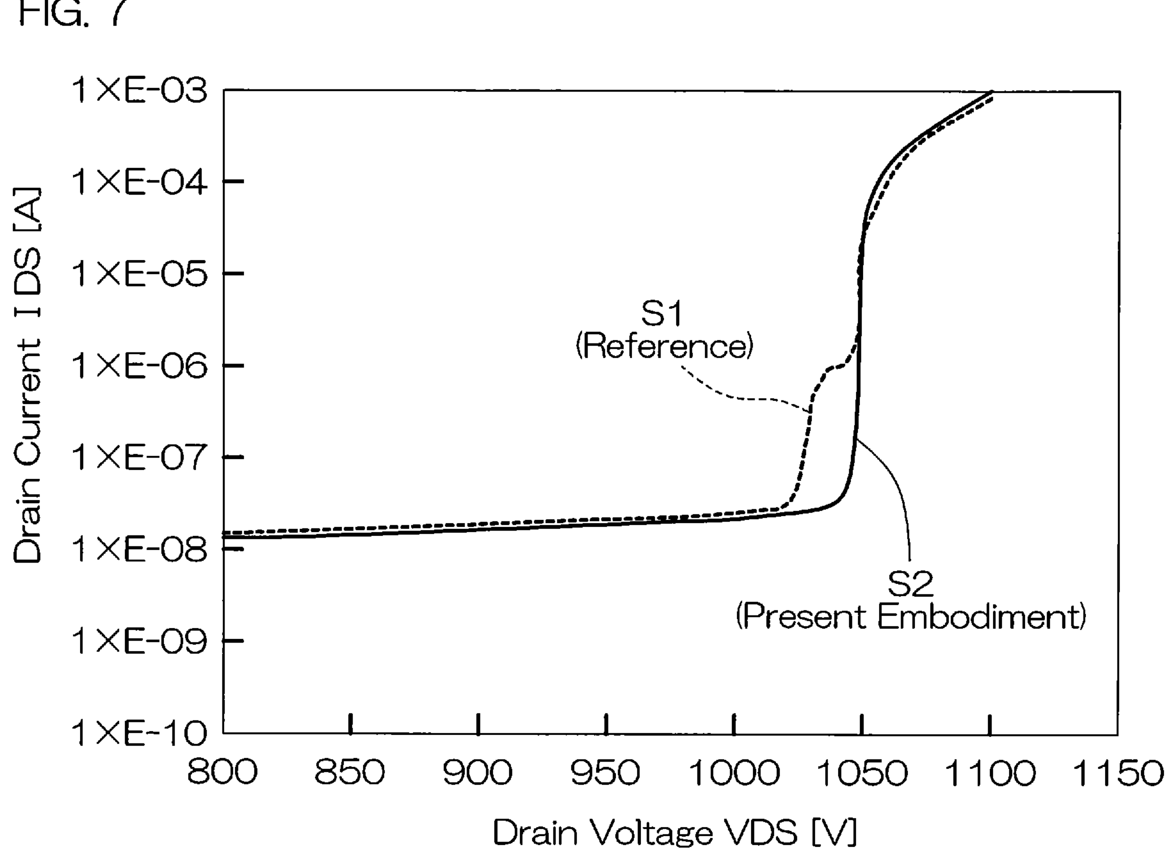
FIG. 7 is a graph showing breakdown characteristics.

FIG. 7 is a graph showing breakdown characteristics (actual measurement values) of the transistor region 9 shown in FIG. 2. In FIG. 7, the vertical axis represents drain current IDS [A], and the horizontal axis represents drain voltage VDS [V]. A first characteristic S1 and a second characteristic S2 are shown in FIG. 7. The first characteristic S1 shows a breakdown characteristic of the transistor region 9 according to a reference example, and the second characteristic S2 shows a breakdown characteristic of the transistor region 9 according to this embodiment. In the transistor region 9 according to the reference example, the RESURF region 21 is uniformly formed in the entire area of a region serving as a current path in the drift region 13.

The characteristic of a breakdown voltage VBD is examined by applying a source voltage VSS of 0 V to the source region 17, and by applying a gate voltage VGS of 0 V to the gate electrode 32, and by applying a drain voltage VDS equal to or more than the source voltage VSS to the drain region 15. Herein, a drain voltage VDS of not less than 800 V and not more than 1100 V is applied to the drain region 15.

Referring to the first characteristic S1, when the drain voltage VDS became equal to or more than 1025 V, the drain current IDS rose steeply in the transistor region 9 according to the reference example. Therefore, the breakdown voltage VBD of the transistor region 9 according to the reference example was about 1025 V. On the other hand, referring to the second characteristic S2, when the drain voltage VDS became equal to or more than 1040 V, the drain current IDS rose steeply in the transistor region 9 according to this embodiment. Therefore, the breakdown voltage VBD of the transistor region 9 according to this embodiment was about 1040 V, and became higher than the breakdown voltage VBD of the transistor region 9 according to the reference example.

In the transistor region 9, a drain current IDS flows from the drain region 15 toward the source region 17 when a drain voltage VDS is applied in an OFF state. This drain current IDS flows through the drift region 13 and the RESURF region 21. Additionally, simultaneously with this, a drain voltage VDS is applied to an end portion of the field electrode 25, and a source voltage VSS is applied to the other end portion of the field electrode 25. Thereby, the field electrode 25 forms a potential gradient that gradually decreases from the drain region 15 toward the source region 17. The potential gradient formed in the field electrode 25 acts on the RESURF region 21, which has a relatively high concentration, through the field insulating film 22.

The RESURF region 21 is formed within a relatively large range of the drift region 13 in the transistor region 9 according to the reference example, and therefore the possibility that an electric charge forming the drain current IDS will be trapped by the field insulating film 22 becomes high because of the potential gradient generated in the field electrode 25. As a result, the possibility that an undesirable trap level will be formed inside the field insulating film 22 and that undesirable electric-field concentration will occur in the drift region 13 or in the RESURF region 21 becomes high. In the transistor region 9 according to the reference example, the breakdown voltage VBD is limited because of such electric-field concentration.

On the other hand, in the transistor region 9 according to this embodiment, the plurality of RESURF arrays 20 are separately arranged in the drift region 13. Therefore, it is possible to reduce the possibility that an electric charge forming the drain current IDS will be trapped by the field insulating film 22. As a result, the undesirable trap level is suppressed from being formed inside the field insulating film 22, and thereby the undesirable electric-field concentration in the drift region 13 or in the RESURF region 21 is suppressed. This makes it possible to improve the breakdown voltage VBD. These effects are also fulfilled in the first to thirteenth layout examples.

As described above, the semiconductor device 1A includes the chip 2, the first potential region 11, the second potential region 12, the n-type drift region 13, the plurality of RESURF arrays 20, the field insulating film 22, and the field electrode 25. The chip 2 has the first main surface 3. The first potential region 11 is formed in the surface layer portion of the first main surface 3. The second potential region 12 is formed in the surface layer portion of the first main surface 3 at a distance from the first potential region 11. The drift region 13 is formed in a region between the first and second potential regions 11 and 12 in the surface layer portion of the first main surface 3.

The plurality of RESURF arrays 20 each include the plurality of n-type RESURF regions 21. The plurality of RESURF regions 21 each have an impurity concentration exceeding that of the drift region 13, and are arranged in the surface layer portion of the drift region 13 at a distance from each other in the first direction X so as to expose a part of the drift region 13 from the first main surface 3. The plurality of RESURF arrays 20 are arranged at a distance from each other in the second direction Y intersecting the first direction X.

The field insulating film 22 covers the drift region 13 and the plurality of RESURF arrays 20 on the first main surface 3. The field electrode 25 is arranged on the field insulating film 22, and covers the plurality of RESURF arrays 20 in a plan view. This structure makes it possible to provide the semiconductor device 1A that is capable of improving electrical characteristics (withstand voltage).

Figure 8:
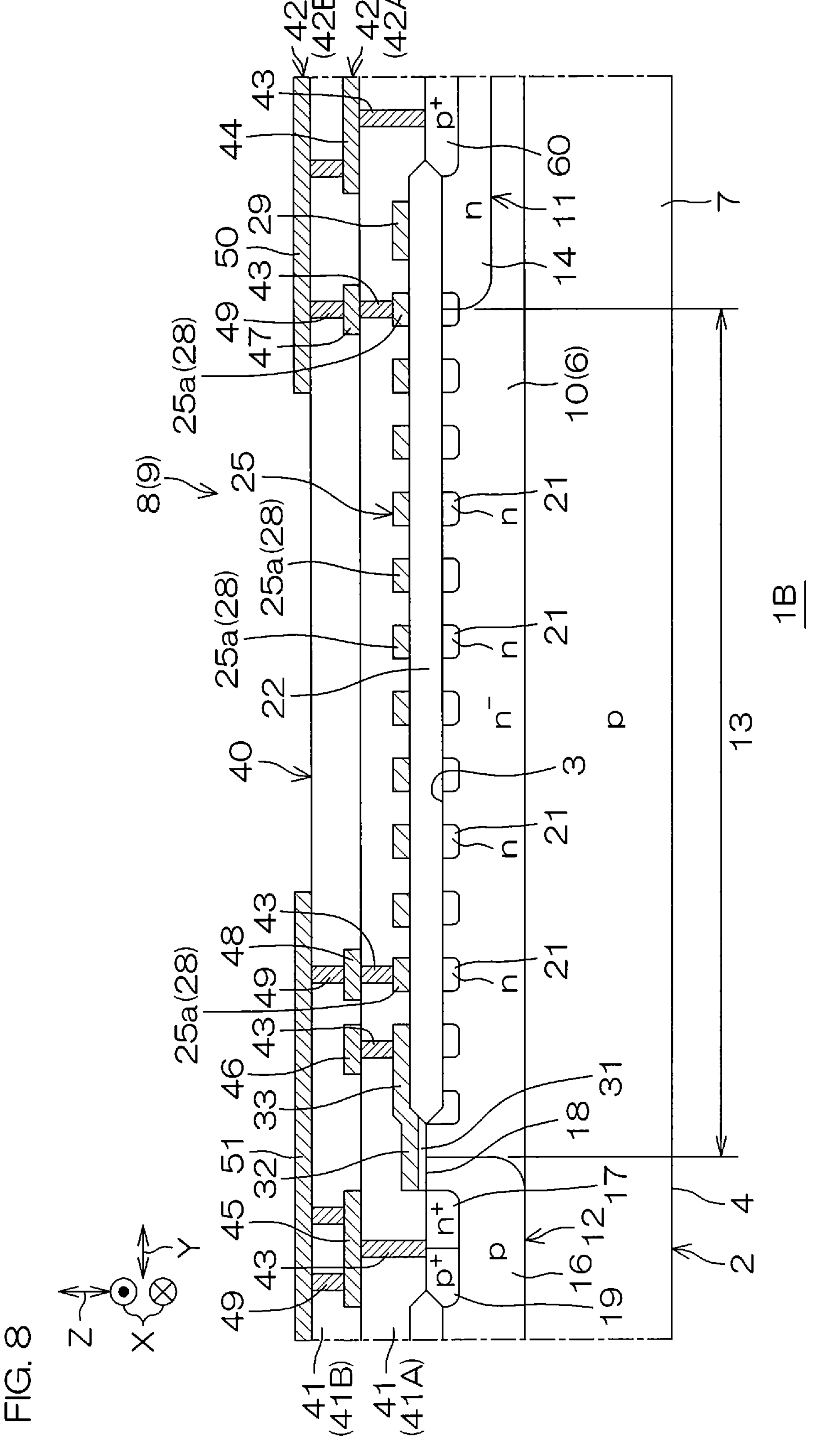
FIG. 8 is a cross-sectional view showing a semiconductor device according to a second embodiment.

FIG. 8 is a cross-sectional view showing a semiconductor device 1B according to a second embodiment. Referring to FIG. 8, the semiconductor device 1B includes IGBT, instead of MISFET, in the transistor region 9. In detail, the semiconductor device 1B includes a p-type collector region 60, instead of the drain region 15, in the first potential region 11.

As described above, this structure makes it possible to provide the semiconductor device 1B that includes IGBT instead of MISFET. In this case, a "source" of MISFET is read as an "emitter" of IGBT. Additionally, a "drain" of MISFET is read as a "collector" of IGBT. The same effect as the effect described with respect to the semiconductor device 1A is fulfilled even if IGBT is employed instead of MISFET.

Figure 9:
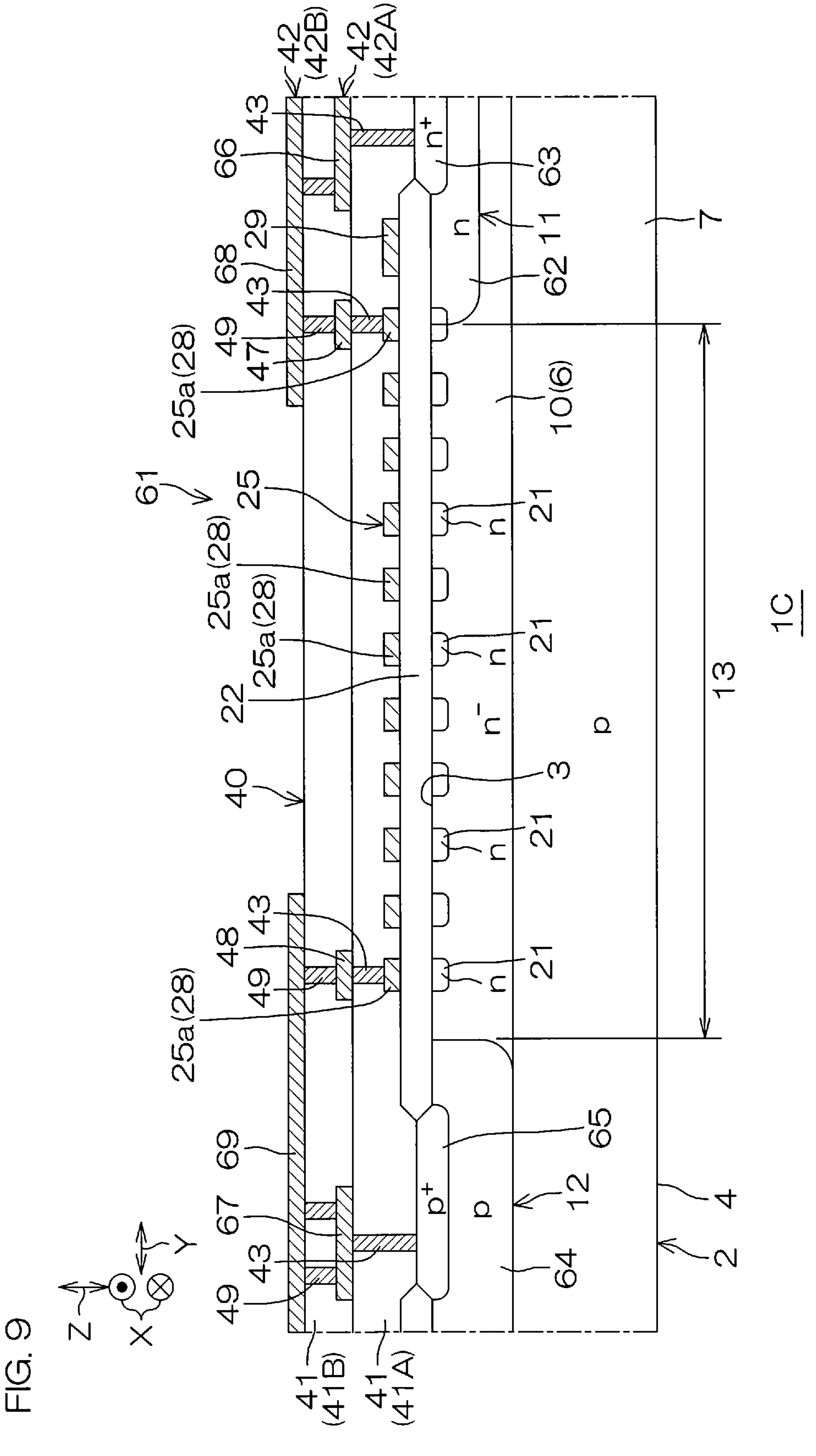
FIG. 9 is a cross-sectional view showing a semiconductor device according to a third embodiment.

FIG. 9 is a cross-sectional view showing a semiconductor device 1C according to a third embodiment. Referring to FIG. 9, the semiconductor device 1C includes a diode region 61 instead of the transistor region 9. The first potential region 11 according to the semiconductor device 1C includes an n-type cathode well region 62 instead of the well region 14, and includes an n-type cathode region 63 instead of the drain region 15. The cathode well region 62 and the cathode region 63 are formed in the same form as the well region 14 and the drain region 15 according to the first embodiment, respectively.

The second potential region 12 according to the semiconductor device 1C includes a p-type anode well region 64 instead of the body region 16, and includes a p-type anode region 65 instead of both the source region 17 and the contact region 19. The anode well region 64 is formed in the same form as the body region 16 according to the first embodiment.

The anode region 65 is formed in a surface layer portion of the anode well region 64. The anode region 65 has a p-type impurity concentration exceeding the p-type impurity concentration of the anode well region 64. The p-type impurity concentration of the anode region 65 may be not less than $1.0\times10^{18}$ $cm^{-3}$ and not more than $1.0\times10^{21}$ $cm^{-3}$.

In this embodiment, the anode region 65 is formed in the first region 16A and the second region 16B at an interval from the first connection region 16C and the second connection region 16D, respectively, of the anode well region 64. In other words, the anode region 65 is not formed in the first connection region 16C and the second connection region 16D of the anode well region 64. The anode region 65 is formed in an ended belt shape extending along the first region 16A and the second region 16B in a plan view.

Thereby, the anode region 65 faces the cathode region 63 in the second direction Y, and forms a current path, which is along the second direction Y between the cathode region 63 and the anode region 65, in the drift region 13. Preferably, the length of the anode region 65 is less than the length of the cathode region 63 in the first direction X.

As a matter of course, the single anode region 65 having an annular shape (in detail, oval annular shape) surrounding the impurity region 10 may be formed. Additionally, the single or the plurality of anode regions 65 may be formed in at least one region among the first region 16A, the second region 16B, the first connection region 16C, and the second connection region 16D of the anode region 65.

The drift region 13 according to the semiconductor device 1C is formed in a region between the cathode well region 62 (cathode region 63) and the anode well region 64 (anode region 65).

The semiconductor device 1C includes the plurality of RESURF arrays 20 (plurality of RESURF regions 21) and the drift exposed region 13*a* that are formed in the surface layer portion of the drift region 13. The plurality of RESURF arrays 20 (plurality of RESURF regions 21) and the drift exposed region 13*a* according to the semiconductor device 1C are formed in the same layout (first to thirteenth layout examples) as the plurality of RESURF arrays 20 (plurality of RESURF regions 21) and the drift exposed region 13*a* according to the first embodiment.

The semiconductor device 1C does not have the gate insulating film 31 and the gate electrode 32. The first wiring film 42A according to the semiconductor device 1C includes a first cathode wiring 66 and a first anode wiring 67 instead of the first drain wiring 44, the first source wiring 45, and the first gate wiring 46. The first cathode wiring 66 and the first anode wiring 67 are formed in the same form as the first drain wiring 44 and the first source wiring 45 according to the first embodiment, respectively. The first cathode wiring 66 may be integrally formed with the inner field wiring 47. The first anode wiring 67 may be integrally formed with the outer field wiring 48.

The second wiring film 42B according to the semiconductor device 1C includes a second cathode wiring 68 and a second anode wiring 69 instead of the second drain wiring 50, the second source wiring 51, and the second gate wiring (not shown). The second cathode wiring 68 and the second anode wiring 69 are formed in the same form as the second drain wiring 50 and the second source wiring 51 according to the first embodiment, respectively.

As described above, this structure makes it possible to provide the semiconductor device 1C including a diode instead of MISFET. The same effect as the effect described with respect to the semiconductor device 1A is fulfilled even if the diode is employed instead of MISFET.

The embodiments mentioned above can be carried out in other modes. For example, the first potential region 11 includes the well region 14 and the drain region 15 as described in the aforementioned first and second embodiments. However, the first potential region 11 that does not include either one or both of the well region 14 and the drain region 15 may be employed.

If the first potential region 11 does not include both of the well region 14 and the drain region 15, the first via electrode 43 is electrically connected to the impurity region 10. In this case, the first via electrode 43 may be directly connected to the impurity region 10, or may be electrically connected to the impurity region 10 through an ohmic electrode (for example, silicide) formed in the surface layer portion of the first main surface 3.

The first potential region 11 includes the cathode well region 62 and the cathode region 63 as described in the aforementioned third embodiment. However, the first potential region 11 that does not include either one or both of the cathode well region 62 and the cathode region 63 may be employed. If the first potential region 11 does not include both of the cathode well region 62 and the cathode region 63, the first via electrode 43 is electrically connected to the impurity region 10. In this case, the first via electrode 43 may be directly connected to the impurity region 10, or may be electrically connected to the impurity region 10 through an ohmic electrode (for example, silicide) formed in the surface layer portion of the first main surface 3.

The plurality of source regions 17 are not formed in the first connection region 16C and in the second connection region 16D as described in each of the aforementioned embodiments. However, the single source region 17 having an annular shape (in detail, oval annular shape) surrounding the impurity region 10 may be formed. In this case, a plurality of circular arc arrays may be formed in the circular arc portion of the drift region 13 in each of the embodiments.

The plurality of circular arc arrays include the plurality of RESURF regions 21 arranged along a circular arc direction of the drift region 13. In this case, the plurality of second line portions 25*b* of the field electrode 25 may cover the plurality of circular arc arrays in the same form as a covering form of the plurality of first line portions 25*a* with respect to the plurality of RESURF arrays 20.

The field electrode 25 is made of the resistance film as described in each of the aforementioned embodiments. However, the field electrode 25 may be formed so as to reach an electrically floating state. The field electrode 25 being in an electrically floating state forms a potential gradient that decreases from the first potential region 11 toward the second potential region 12 because of the electric field of the drift region 13.

Therefore, the same effect as the effect described with respect to the semiconductor device 1A is fulfilled even if the field electrode 25 being in an electrically floating state is employed. In this case, the field electrode 25 including at least one line portion (annular portion) that concentrically surrounds the first potential region 11 multiple times may be formed. At least one line portion (annular portion) may be formed in an endless shape, or may be formed in an ended shape.

The diode described in the aforementioned third embodiment may be formed in the same chip 2 (first main surface 3) as the MISFET according to the first embodiment. In this case, the MISFET according to the first embodiment is formed in one device region 8 (transistor region 9), and the diode according to the third embodiment is formed in the other device region 8 (diode region 61). Additionally, in this case, the diode may make an inverse-parallel connection with the MISFET as a reflux diode of the MISFET.

The diode described in the aforementioned third embodiment may be formed in the same chip 2 (first main surface 3) as the IGBT according to the second embodiment. In this case, the IGBT according to the second embodiment is formed in one device region 8 (transistor region 9), and the diode according to the third embodiment is formed in the other device region 8 (diode region 61). Additionally, in this case, the diode may make an inverse-parallel connection with the IGBT as a reflux diode of the IGBT.

The field electrode 25 according to each of the aforementioned embodiments may be used as a current monitor device that detects an electric current flowing between the first and second potential regions 11 and 12. This configuration makes it possible to indirectly detect an electric current flowing through the field electrode 25 or an electric current flowing between the first and second potential regions 11 and 12 from a voltage drop in the field electrode 25. Therefore, it is possible to appropriately distribute an electric field by means of the field electrode 25, and, simultaneously, it is possible to raise convenience by means of the current monitor function of the field electrode 25.

The first conductivity type is an n-type, and the second conductivity type is a p-type as described in each of the aforementioned embodiments. However, the first conductivity type may be a p-type, and the second conductivity type may be an n-type. A concrete configuration in this case can be obtained by replacing the n-type region with the p-type region and by replacing the p-type region with the n-type region in the foregoing description and in the accompanying drawings.

The first and second directions X and Y are determined by the extending direction of the first to fourth side surfaces 5A to 5D as described in each of the aforementioned embodiments. However, the first and second directions X and Y may be arbitrary directions as long as the relationship of intersecting each other (in detail, perpendicularly intersecting each other) is maintained.

Characteristic examples extracted from this description and from the drawings are hereinafter shown. A semiconductor device capable of improving electrical characteristics is hereinafter provided. Hereinafter, alphanumeric characters in parentheses represent corresponding components in the aforementioned embodiments, and yet this representation does not denote that the scope of each clause is limited to the embodiments.

[A1] A semiconductor device (1A, 1B, 1C) comprising: a chip (2) having a main surface (3); a first potential region (11) formed in a surface layer portion of the main surface (3); a second potential region (12) formed in the surface layer portion of the main surface (3) at a distance from the first potential region (11); a first conductivity type (n-type) drift region (13) formed in a region between the first potential region (11) and the second potential region (12) in the surface layer portion of the main surface (3); a plurality of RESURF arrays (20) each of which includes a plurality of first conductivity type (n-type) RESURF regions (21) arranged in a surface layer portion of the drift region (13) at a distance from each other in a first direction (X) so as to expose a part of the drift region (13) from the main surface (3), each of the RESURF regions (21) having an impurity concentration exceeding an impurity concentration of the drift region (13), the plurality of RESURF arrays (20) being arranged at a distance from each other in a second direction (Y) that intersects the first direction (X); a field insulating film (22) covering the drift region (13) and the plurality of RESURF arrays (20) on the main surface (3); and a field electrode (25) arranged on the field insulating film (22) so as to cover the plurality of RESURF arrays (20).

[A2] The semiconductor device (1A, 1B, 1C) according to A1, wherein the field electrode (25) is linearly drawn around along the plurality of RESURF array (20) so as to cover each of the RESURF arrays (20) in a plan view.

[A3] The semiconductor device (1A, 1B, 1C) according to A1 or A2, wherein the field electrode (25) includes a plurality of line portions (25*a*) each of which linearly extends along the first direction (X) so as to cover each of the plurality of RESURF arrays (20) in a plan view and that are formed at a distance from each other in the second direction (Y).

[A4] The semiconductor device (1A, 1B, 1C) according to A3, wherein at least one of the line portions (25*a*) covers three or less of the RESURF arrays (20).

[A5] The semiconductor device (1A, 1B, 1C) according to A3 or A4, wherein at least one of the line portions (25*a*) covers only one of the RESURF arrays (20).

[A6] The semiconductor device (1A, 1B, 1C) according to any one of A3 to A5, wherein at least one of the line portions (25*a*) covers an entire area of the plurality of RESURF regions (21) included in a corresponding one of the plurality of RESURF arrays (20) in a plan view.

[A7] The semiconductor device (1A, 1B, 1C) according to any one of A3 to A6, wherein at least one of the line portions (25*a*) exposes an end portion, which is located on a side of the first potential region (11), of the plurality of RESURF regions (21) in a plan view.

[A8] The semiconductor device (1A, 1B, 1C) according to any one of A3 to A7, wherein at least one of the line portions (25*a*) exposes an end portion, which is located on a side of the second potential region (12), of the plurality of RESURF regions (21) in a plan view.

[A9] The semiconductor device (1A, 1B, 1C) according to any one of A3 to A8, wherein at least one of the line portions (25*a*) exposes a region between two, which adjoin each other, of the RESURF arrays (20) so as to cover each part of the adjoining two RESURF arrays (20) in a plan view.

[A10] The semiconductor device (1A, 1B, 1C) according to any one of A1 to A9, wherein the field electrode (25) surrounds the first potential region (11) multiple times.

[A11] The semiconductor device (1A, 1B, 1C) according to any one of A1 to A10, wherein the field electrode (25) is electrically connected to the first potential region (11) and to the second potential region (12).

[A12] The semiconductor device (1A, 1B, 1C) according to any one of A1 to A10, wherein the field electrode (25) is electrically separated from the first potential region (11) and from the second potential region (12).

[A13] The semiconductor device (1A, 1B, 1C) according to any one of A1 to A12, wherein at least one of the RESURF arrays (20) includes the plurality of RESURF regions (21) each of which is formed in a belt shape extending in the second direction (Y).

[A14] The semiconductor device (1A, 1B, 1C) according to any one of A1 to A13, wherein at least one of the RESURF arrays (20) includes the plurality of RESURF regions (21) arranged so as to mutually deviate in a relative position in the second direction (Y).

[A15] The semiconductor device (1A, 1B, 1C) according to any one of A1 to A14, wherein the first potential region (11) includes a first conductivity type (n-type) drain region (15) formed in the surface layer portion of the main surface (3), the second potential region (12) includes a second conductivity type (p-type) body region (16) formed in the surface layer portion of the main surface (3) and a first conductivity type (n-type) source region (17) formed in a surface layer portion of the body region (16), the drift region (13) is formed in a region between the drain region (15) and the body region (16) in the surface layer portion of the main surface (3), and the plurality of RESURF arrays (20) are formed in a region between the drain region (15) and the source region (17) in the surface layer portion of the drift region (13).

[A16] The semiconductor device (1A, 1B, 1C) according to A15, wherein the first potential region (11) includes a first conductivity type (n-type) well region (14) formed in the surface layer portion of the main surface (3) and the drain region (15) formed in a surface layer portion of the well region (14), and the plurality of RESURF arrays (20) are formed in a region between the well region (14) and the source region (17) in the surface layer portion of the drift region (13).

[A17] The semiconductor device (1A, 1B, 1C) according to A15 or A16, wherein the plurality of RESURF arrays (20) are formed only in a region interposed between the drain region (15) and the source region (17) in the drift region (13).

[A18] The semiconductor device (1A, 1B, 1C) according to any one of A15 to A17, wherein the body region (16) is formed in an endless shape surrounding the drain region (15) in a plan view, and the source region (17) is formed in an ended shape in a plan view.

[A19] The semiconductor device (1A, 1B, 1C) according to any one of A15 to A18, further comprising a channel region (18) formed between the drift region (13) and the source region (17) in the surface layer portion of the body region (16), a gate insulating film (31) covering the channel region (18) on the main surface (3), and a gate electrode (32) formed on the gate insulating film (31).

[A20] The semiconductor device (1A, 1B, 1C) according to A19, wherein the gate electrode (32) has a lead-out portion (33) that is led out from above the gate insulating film (31) onto the field electrode (25).

Although the embodiments have been described in detail, these embodiments are merely specific examples used to clarify the technical contents, and the present invention should not be interpreted by being limited to these specific examples, and the scope of the present invention is limited by the appended claims.

The invention claimed is:

1. A semiconductor device comprising:

a chip having a main surface;

a first potential region formed in a surface layer portion of the main surface;

a second potential region formed in the surface layer portion of the main surface at a distance from the first potential region;

a first conductivity type drift region formed in a region between the first potential region and the second potential region in the surface layer portion of the main surface;

RESURF arrays each of which includes first conductivity type RESURF regions arranged in a surface layer portion of the drift region at a distance from each other in a first direction so as to expose a part of the drift region from the main surface, each of the RESURF regions having an impurity concentration exceeding an impurity concentration of the drift region, the RESURF arrays being arranged at a distance from each other in a second direction that intersects the first direction;

a field insulating film covering the drift region and the RESURF arrays on the main surface; and a field electrode arranged on the field insulating film so as to cover the RESURF arrays.

2. The semiconductor device according to claim 1, wherein the field electrode is linearly drawn around along the RESURF arrays so as to cover each of the RESURF arrays in a plan view.

3. The semiconductor device according to claim 1, wherein the field electrode includes line portions each of which linearly extends along the first direction so as to cover each of the RESURF arrays in a plan view and that are formed at a distance from each other in the second direction.

4. The semiconductor device according to claim 3, wherein at least one of the line portions covers three or less of the RESURF arrays.

5. The semiconductor device according to claim 3, wherein at least one of the line portions covers only one of the RESURF arrays.

6. The semiconductor device according to claim 3, wherein at least one of the line portions covers an entire area of the RESURF regions included in a corresponding one of the RESURF arrays in a plan view.

7. The semiconductor device according to claim 3, wherein at least one of the line portions exposes an end portion, which is located on a side of the first potential region, of the RESURF regions in a plan view.

8. The semiconductor device according to claim 3, wherein at least one of the line portions exposes an end portion, which is located on a side of the second potential region, of the RESURF regions in a plan view.

9. The semiconductor device according to claim 3, wherein at least one of the line portions exposes a region between two, which adjoin each other, of the RESURF arrays so as to cover each part of the adjoining two RESURF arrays in a plan view.

10. The semiconductor device according to claim 1, wherein the field electrode surrounds the first potential region multiple times.

11. The semiconductor device according to claim 1, wherein the field electrode is electrically connected to the first potential region and to the second potential region.

12. The semiconductor device according to claim 1, wherein the field electrode is electrically separated from the first potential region and from the second potential region.

13. The semiconductor device according to claim 1, wherein at least one of the RESURF arrays includes the RESURF regions each of which is formed in a belt shape extending in the second direction.

14. The semiconductor device according to claim 1, wherein at least one of the RESURF arrays includes the RESURF regions arranged so as to mutually deviate in a relative position in the second direction.

15. The semiconductor device according to claim 1, wherein the first potential region includes a first conductivity type drain region formed in the surface layer portion of the main surface, the second potential region includes a second conductivity type body region formed in the surface layer portion of the main surface and a first conductivity type source region formed in a surface layer portion of the body region, the drift region is formed in a region between the drain region and the body region in the surface layer portion of the main surface, and the RESURF arrays are formed in a region between the drain region and the source region in the surface layer portion of the drift region.

16. The semiconductor device according to claim 15, wherein the first potential region includes a first conductivity type well region formed in the surface layer portion of the main surface and the drain region formed in a surface layer portion of the well region, and the RESURF arrays are formed in a region between the well region and the source region in the surface layer portion of the drift region.

17. The semiconductor device according to claim 15, wherein the RESURF arrays are formed only in a region interposed between the drain region and the source region in the drift region.

18. The semiconductor device according to claim 15, wherein the body region is formed in an endless shape surrounding the drain region in a plan view, and the source region is formed in an ended shape in a plan view.

19. The semiconductor device according to claim 15, further comprising:

a channel region formed between the drift region and the source region in the surface layer portion of the body region;

a gate insulating film covering the channel region on the main surface; and a gate electrode formed on the gate insulating film.

20. The semiconductor device according to claim 19, wherein the gate electrode has a lead-out portion that is led out from above the gate insulating film onto the field electrode.

* * * * *